US011869912B2

(12) United States Patent
Hsieh

(10) Patent No.: US 11,869,912 B2
(45) Date of Patent: Jan. 9, 2024

(54) METHOD FOR DEFINING A GAP HEIGHT WITHIN AN IMAGE SENSOR PACKAGE

(71) Applicant: SEMICONDUCTOR COMPONENTS INDUSTRIES, LLC, Phoenix, AZ (US)

(72) Inventor: Yu-Te Hsieh, Taoyuan (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 525 days.

(21) Appl. No.: 16/948,792

(22) Filed: Oct. 1, 2020

(65) Prior Publication Data

US 2022/0020800 A1 Jan. 20, 2022

Related U.S. Application Data

(60) Provisional application No. 62/705,769, filed on Jul. 15, 2020.

(51) Int. Cl.
*H01L 27/146* (2006.01)

(52) U.S. Cl.
CPC .. *H01L 27/14625* (2013.01); *H01L 27/14614* (2013.01); *H01L 27/14634* (2013.01)

(58) Field of Classification Search
CPC ......... H01L 27/14634; H01L 27/14601; H01L 27/146; H01L 27/14636; H01L 27/14614; H01L 27/14625
See application file for complete search history.

(56) References Cited

U.S. PATENT DOCUMENTS

| | | | | |
|---|---|---|---|---|
| 8,269,187 B2* | 9/2012 | Tomuta | ................... | H01L 24/14 |
| | | | | 250/389 |
| 8,748,926 B2* | 6/2014 | Liu | ................... | H01L 27/14632 |
| | | | | 438/22 |
| 9,515,108 B2* | 12/2016 | Hsieh | ................ | H01L 27/14618 |
| 10,048,118 B2* | 8/2018 | Park | .................. | H01L 27/14634 |
| 11,289,522 B2* | 3/2022 | Wu | .................... | H01L 27/14634 |
| 11,444,111 B2* | 9/2022 | Hsieh | ................ | H01L 27/14683 |
| 2008/0191333 A1 | 8/2008 | Yang et al. | | |
| 2008/0191334 A1 | 8/2008 | Lee et al. | | |
| 2010/0105160 A1 | 4/2010 | Singh et al. | | |
| 2014/0070411 A1* | 3/2014 | Okada | ..................... | H01L 23/10 |
| | | | | 257/737 |
| 2015/0011038 A1* | 1/2015 | Huang | ............. | H01L 27/14618 |
| | | | | 438/66 |
| 2016/0268325 A1* | 9/2016 | Hsieh | ................ | H01L 27/14683 |
| 2016/0344908 A1* | 11/2016 | Motomura | ............ | H04N 25/75 |
| 2017/0052263 A1* | 2/2017 | Jadrich | ................... | H01L 31/18 |
| 2017/0059395 A1* | 3/2017 | Park | ...................... | G01J 1/0403 |
| 2019/0172861 A1* | 6/2019 | Hsieh | ..................... | H01L 23/60 |

(Continued)

*Primary Examiner* — John R Lee
(74) *Attorney, Agent, or Firm* — Brake Hughes Bellermann LLP

(57) ABSTRACT

According to an aspect, a method for fabricating an image sensor package to define a gap height includes coupling an image sensor die to a substrate, forming a plurality of pillar members on the image sensor die, dispensing a bonding material on the image sensor die, contacting a transparent member with the bonding material such that a height of the pillar members defines a gap height between an active region of the image sensor die and the transparent member, and curing the bonding material to couple the transparent member to the image sensor die.

20 Claims, 14 Drawing Sheets

(56) References Cited

U.S. PATENT DOCUMENTS

| | | | | |
|---|---|---|---|---|
| 2020/0111829 A1* | 4/2020 | Fan | .................... | H01L 27/14632 |
| 2020/0152681 A1* | 5/2020 | Wu | .................... | H01L 27/14685 |
| 2020/0312897 A1* | 10/2020 | Hsieh | ................ | H01L 27/14618 |
| 2020/0321375 A1* | 10/2020 | Wu | ...................... | H01L 27/1469 |
| 2022/0020800 A1* | 1/2022 | Hsieh | ................ | H01L 27/14618 |
| 2022/0216255 A1* | 7/2022 | Hsieh | ................ | H01L 27/14636 |
| 2022/0216256 A1* | 7/2022 | Wu | ................... | H01L 27/14634 |

* cited by examiner

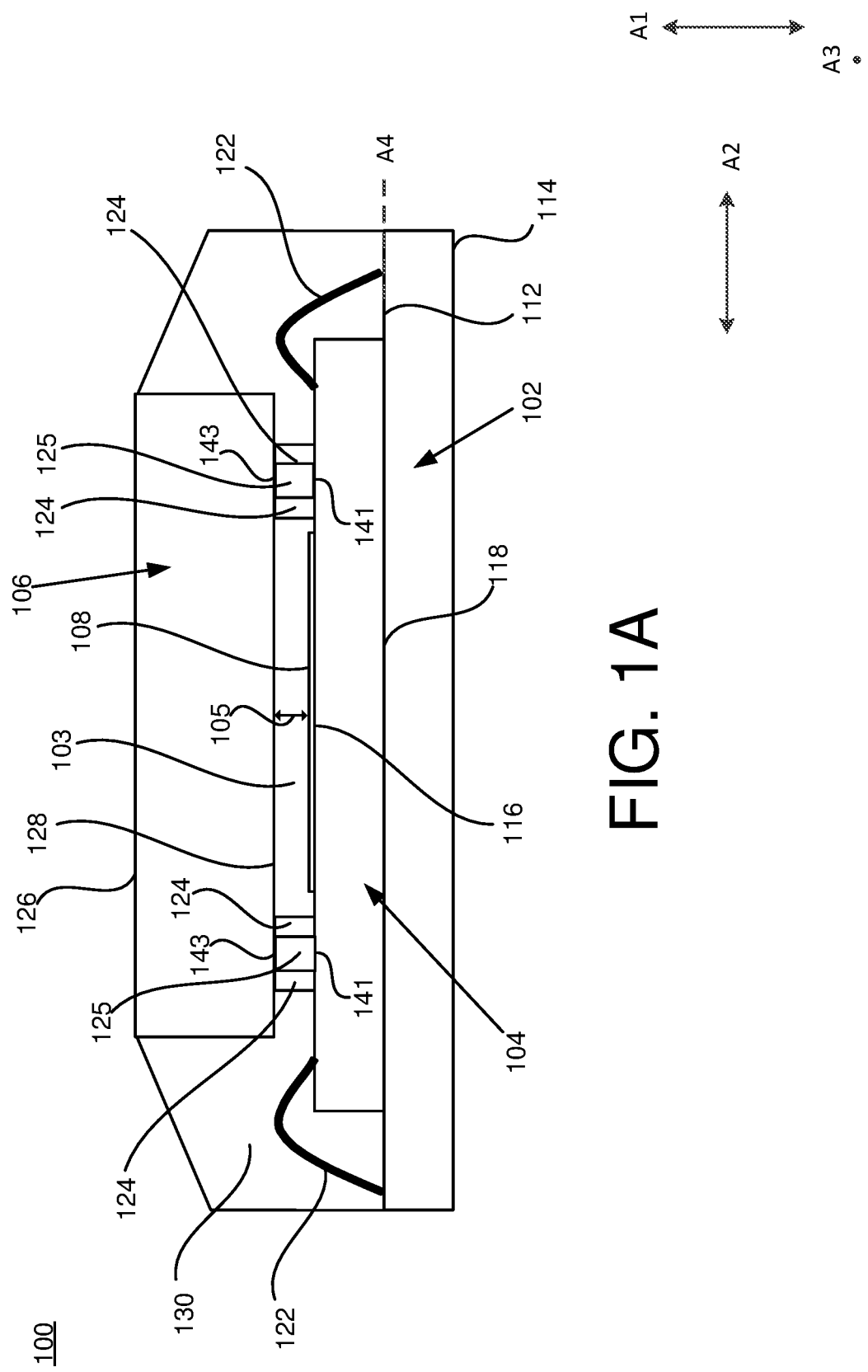

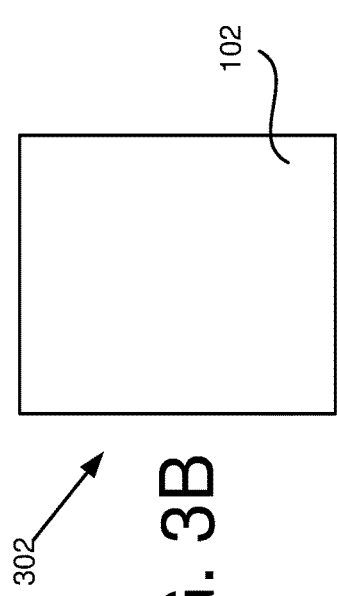
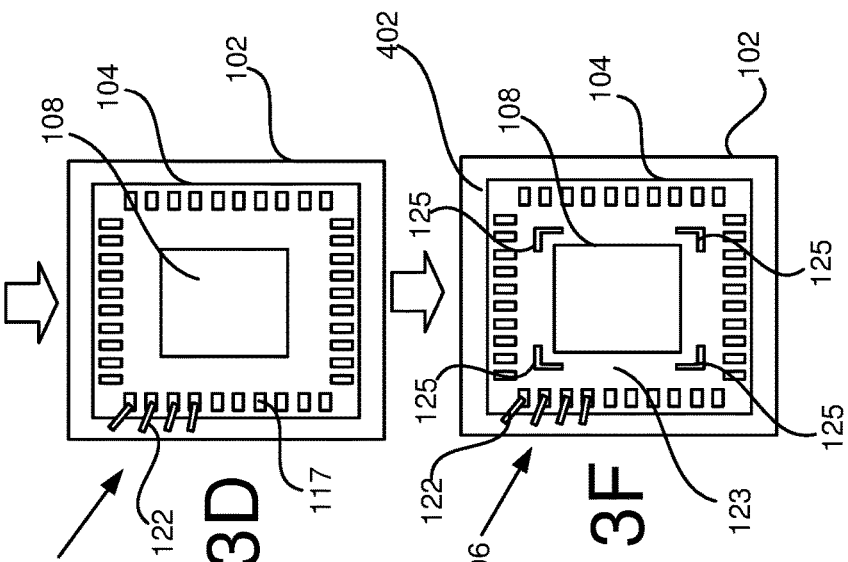
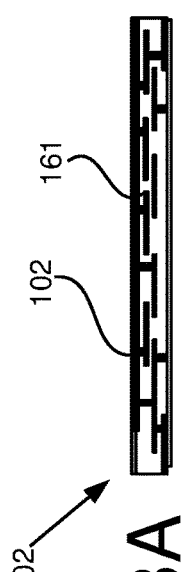
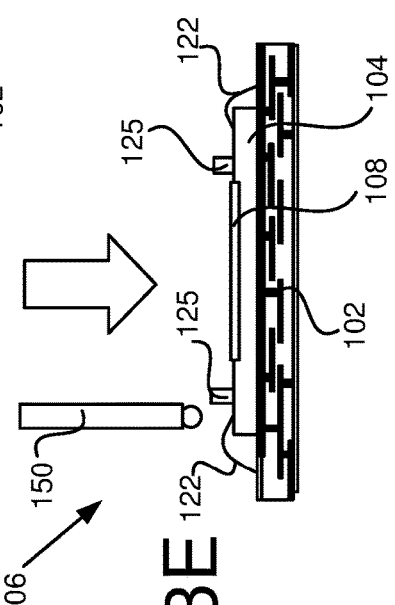

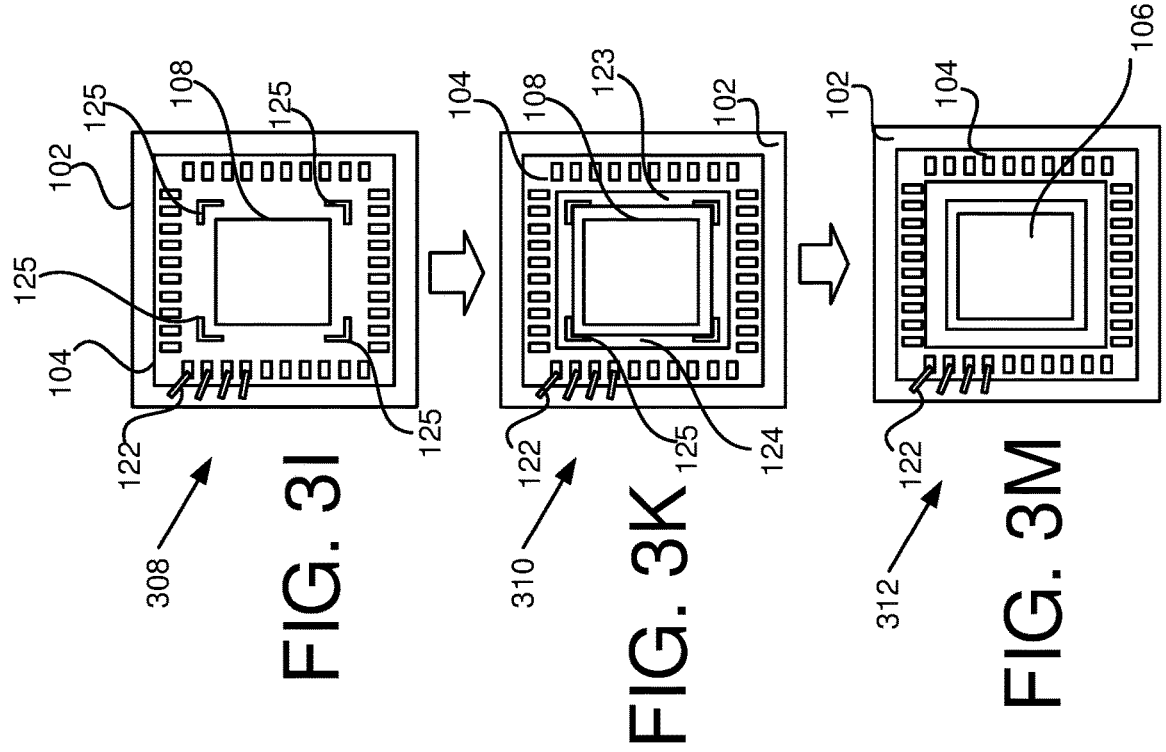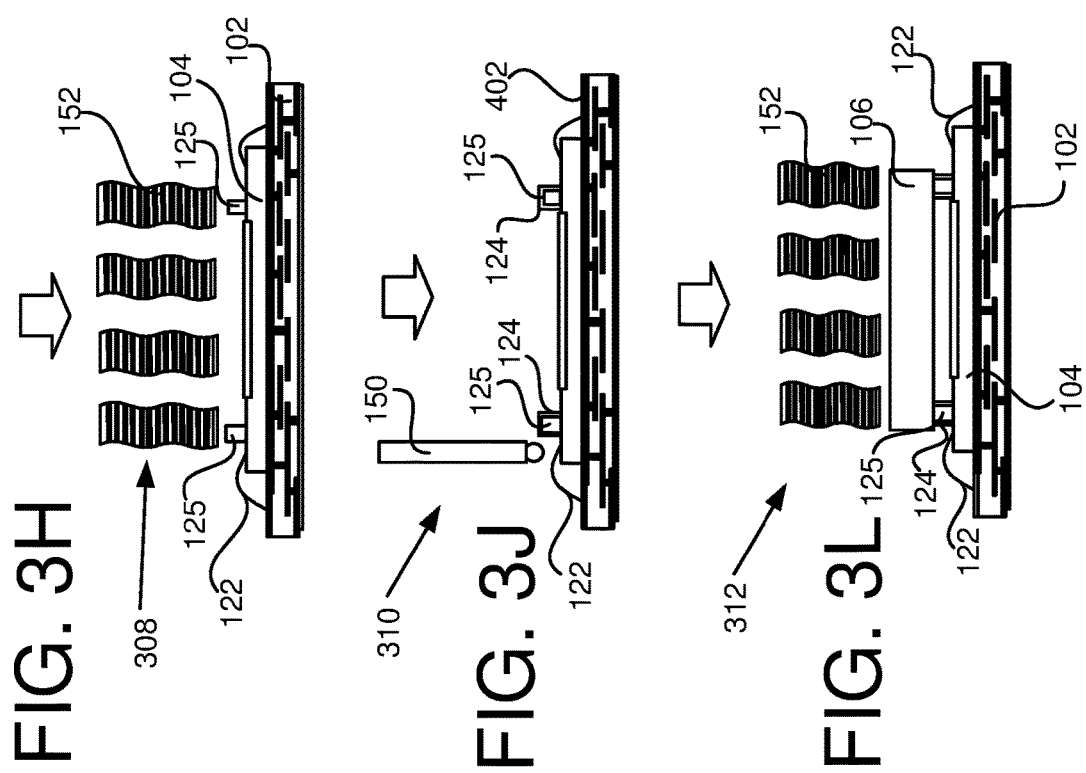

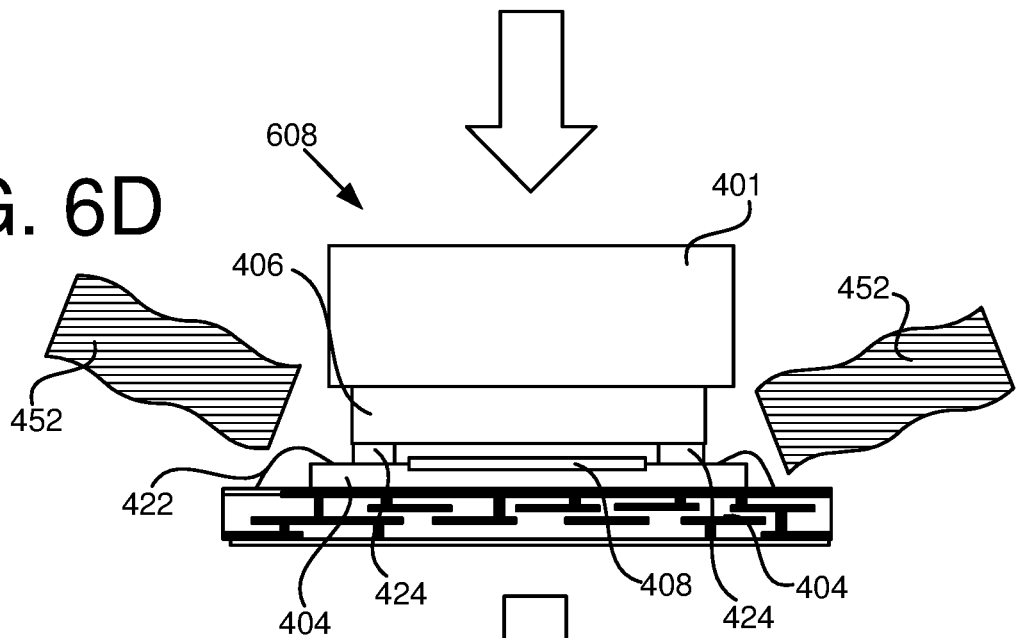
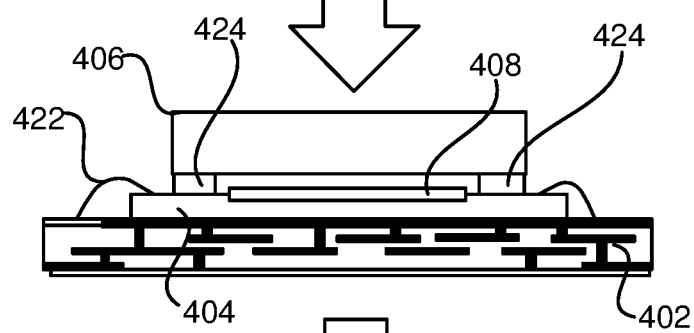
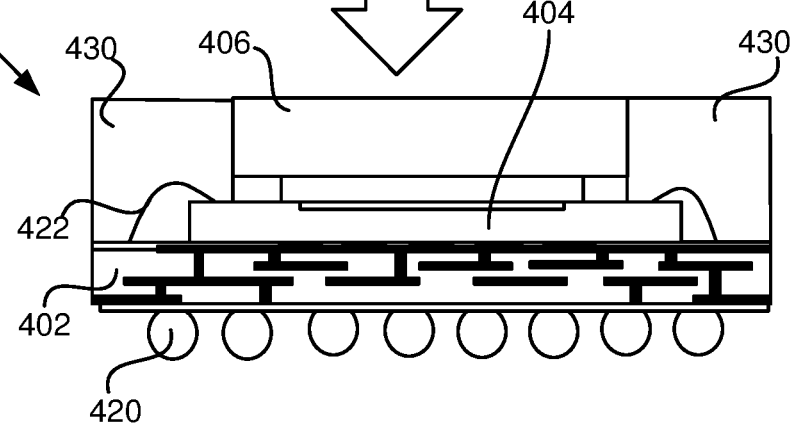

METHOD FOR DEFINING A GAP HEIGHT WITHIN AN IMAGE SENSOR PACKAGE

CROSS-REFERENCE TO RELATED APPLICATIONS

This application claims the benefit of U.S. Provisional Patent Application No. 62/705,769, filed on Jul. 15, 2020, the entire contents of which is incorporated herein by reference.

TECHNICAL FIELD

This description relates to a method for controlling a gap height within an image sensor package.

BACKGROUND

Within an image sensor package, an image sensor die is coupled to a glass substrate with a bonding material. The thickness of the bonding material may define the height of an air gap between the image sensor die and the glass substrate. According to some conventional manufacturing approaches, controlling the gap height in an accurate manner is relatively difficult. For example, the bonding material is dispensed on the image sensor die, and then the glass substrate may be dropped on the bonding material, thereby making the gap height depend upon the resin volume and viscosity of the bonding material. This may cause variations in the gap height during production of image sensor packages.

SUMMARY

According to an aspect, a method for fabricating an image sensor package to define a gap height includes coupling an image sensor die to a substrate, forming a plurality of pillar members on the image sensor die, dispensing a bonding material on the image sensor die, contacting a transparent member with the bonding material such that a height of the pillar members defines a gap height between an active region of the image sensor die and the transparent member, and curing the bonding material to couple the transparent member to the image sensor die.

According to some aspects, the method may include one or more of the following features (or any combination thereof). The forming the plurality of pillar members on the image sensor die may include dispensing a liquid epoxy resin on the image sensor die and curing the liquid epoxy resin to form the plurality of pillar members. The liquid epoxy resin is cured using ultraviolet (UV) light. The forming the plurality of pillar members on the image sensor die may include creating conductive members. The bonding material is dispensed on the pillar members such that the bonding material encompasses the plurality of pillar members. The bonding material is dispensed on a perimeter portion of a mount area of the image sensor die. Each of the plurality of pillar members is formed on a separate corner portion of the mount area of the image sensor die. The bonding material includes a liquid epoxy resin, where the liquid epoxy resin is cured to form a solid bonding material. The method may include coupling bond wires to the image sensor die and to the substrate before the plurality of pillar members are formed on the image sensor die. The method may include dispensing a molding material on the substrate after the bonding material is cured.

According to an aspect, a method for fabricating an image sensor package to define a gap height includes coupling an image sensor die to a substrate, coupling bond wires to the image sensor die and to the substrate, forming a plurality of pillar members on a mount area of the image sensor die, the mount area being disposed outside an active region of the image sensor die, dispensing a bonding material on the mount area of the image sensor die, contacting a transparent member with the bonding material such that a height of the plurality of pillar members defines a gap height between the active region of the image sensor die and the transparent member, and curing the bonding material to couple the transparent member to the image sensor die.

According to some aspects, the method may include one or more of the above/below features (or any combination thereof). The forming the plurality of pillar members on the mount area of the image sensor die may include dispensing a liquid epoxy resin on corner portions of the mount area of the image sensor die and curing the liquid epoxy resin to form the plurality of pillar members. The forming the plurality of pillar members on the mount area of the image sensor die may include creating a conductive member on a separate corner portion of the mount area of the image sensor die. A pillar member of the plurality of pillar members may include a first linear portion and a second linear portion, where the second linear portion is disposed at a non-zero angle with respect to the first linear portion. The bonding material is dispensed on a perimeter portion of the mount area of the image sensor die, where the bonding material covers the plurality of pillar members.

According to an aspect, a method for fabricating an image sensor package to define a gap height includes dispensing a bonding material on a mount area of an image sensor die, the image sensor die being coupled to a substrate, coupling a transparent member to a bond head, moving the bond head to a programmable position to place the transparent member in contact with the bonding material, where the programmable position defines a gap height between an active region of the image sensor die and the transparent member, curing the bonding material to couple the transparent member to the image sensor die while the bond head is coupled to the transparent member, and releasing the bond head from the transparent member.

According to some aspects, the method may include one or more of the following features (or any combination thereof). The method may include reprogramming, using a controller operably coupled to the bond head, the position to increase the gap height between the active region of the image sensor die and the transparent member. The bonding material includes a liquid epoxy resin that is cured to form a solid bonding material, where the epoxy resin has a viscosity greater than a threshold level. The coupling the transparent member to the bond head includes activating vacuum suction on the bond head. The releasing the bond head from the transparent member includes deactivating vacuum suction on the bond head. The method may include dispensing a molding material on the substrate after the bond head is released from the transparent member.

The details of one or more implementations are set forth in the accompanying drawings and the description below. Other features will be apparent from the description and drawings, and from the claims.

BRIEF DESCRIPTION OF THE DRAWINGS

FIGS. 1A through 1C illustrate an image sensor package configured to be fabricated in a manner that permits a gap height to be controlled according to an aspect.

FIGS. 3A through 3N illustrate a flowchart for fabricating an image sensor package.

FIGS. 6A through 6F illustrate a flowchart for fabricating an image sensor package.

DETAILED DESCRIPTION

Figure 1C:
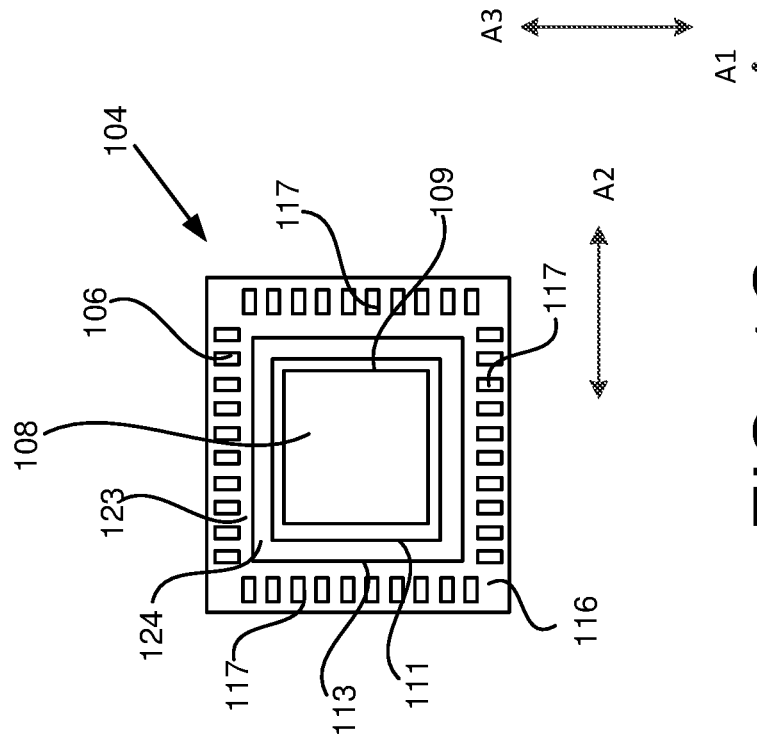

The present disclosure relates to a method of defining (e.g., controlling) a gap height between an image sensor die and a transparent member. For example, during production of an image sensor package, an image sensor die is coupled to a substrate, and pillar members are formed on a mount area of the image sensor die. The mount area may be the space in which bonding material is dispensed in order to couple a transparent member (e.g., a glass substrate) to the image sensor die. In some examples, a pillar member is formed on a separate corner portion of the mount area. In some examples, the pillar members are formed by dispensing a liquid epoxy resin on the corner portions of the mount area of the image sensor die and curing the liquid epoxy resin (e.g., using ultraviolet (UV) light or heat/baking) to form the pillar members. In some examples, the pillar members include conductive members (e.g., metal bumps) formed by a lithography and plating process.

As further discussed below, the height of the pillar members may define the gap height between the active region of the image sensor die and the transparent member. After the pillar members are formed, a bonding material (e.g., a liquid epoxy resin) is dispensed on the mount area of the image sensor die (thereby covering the pillar members). Then, the transparent member is placed on the bonding material, where the bonding material is cured to couple the transparent member to the image sensor die. In some examples, the bonding material is dispensed around a perimeter area of the mount area of the image sensor die.

The height of the pillar members may control (or define) the gap height between the active region of the image sensor die and the transparent member. When the transparent member is placed (e.g., dropped) on the bonding material (which is not yet cured and may be still liquid), the rigid structure of the pillar members contact the transparent material and hold the transparent material a distance away from the image sensor die, thereby providing a relatively precise gap height. In this manner, the gap height is not dependent upon the resin volume and viscosity of the bonding material, but rather the height of the pillar members.

In some examples, a bonding material (e.g., a liquid epoxy resin) is dispensed on the mount area of the image sensor die. Then, a transparent member is coupled to a bond head. The bond head may be moved to place the transparent member in contact with the bonding material. The bond head may be a movable component that uses vacuum suction to couple the transparent member and move the transparent member to a programmable position. The programmable position may define the gap height between the active region of the image sensor die and the transparent member. Then, the bonding material is cured to couple the transparent member to the image sensor while the bond head is coupled to the transparent member. Then, the bond head is released from the transparent member. In some examples, the position is reprogrammed using a controller operable coupled to the bond head in order to increase the gap height between the active region of the image sensor die and the transparent member. In this manner, the transparent member is not dropped on the bonding material, but rather placed in the desired position away from the image sensor die in order to define the gap height. Using these techniques, the gap height is not dependent upon the resin volume and viscosity of the bonding material, but rather the position of the bond head, thereby making the gap height more precise.

Figure 1B:
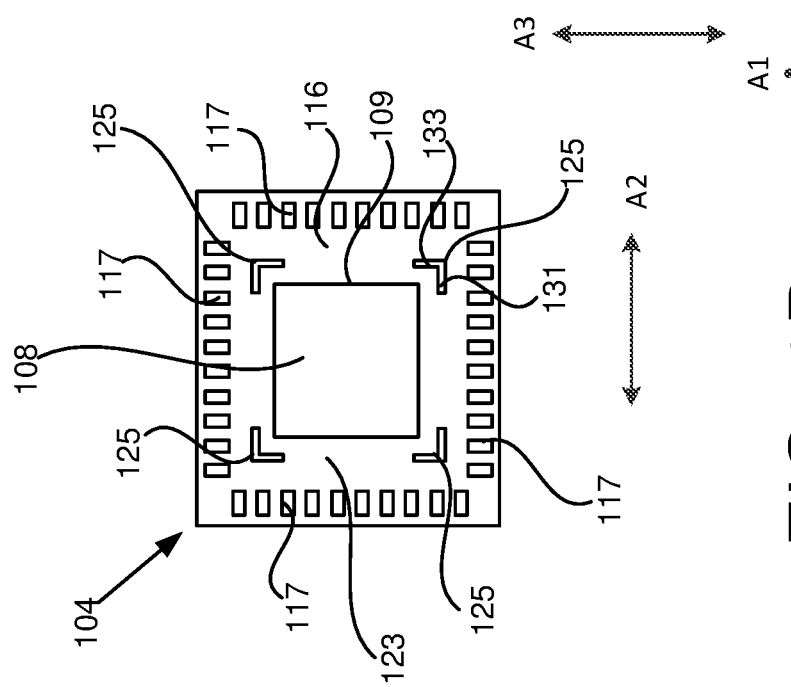

FIGS. 1A through 1C illustrate an image sensor package 100 configured to be fabricated in a manner that permits a gap height 105 to be controlled according to an aspect. In some examples, the image sensor package 100 includes a complementary metal-oxide-semiconductor (CMOS) image sensor (CIS) package. The image sensor package 100 includes a substrate 102, an image sensor die 104 coupled to the substrate 102, and a transparent member 106 coupled to the image sensor die 104 such that an air gap 103 exists between the transparent member 106 and an active region 108 of the image sensor die 104.

The substrate 102 includes a first surface 112 and a second surface 114. The first surface 112 of the substrate 102 is disposed in a plane A4. In some examples, the second surface 114 is disposed in parallel with the first surface 112. A direction A1 is aligned perpendicular to the plane A4, and a direction A2 is perpendicular to the direction A1. A direction A3 is aligned parallel to the plane A4 and is orthogonal to directions A1 and A2. As shown in FIG. 1A, the direction A3 is depicted into the page (shown as a dot). FIG. 1A depicts a side view of the image sensor package 100. FIGS. 1B and 1C depict a top view of the image sensor die 104. For example, FIG. 1B illustrates the image sensor die 104 with pillar members 125 disposed at corner portions of a mount area 123 before a bonding material 124 is applied. FIG. 1C illustrates the image sensor die 104 with the bonding material 124 applied to the mount area 123, where the bonding material 124 covers the pillar members 125. Since FIGS. 1B and 1C depict a different orientation than FIG. 1A, the direction A1 is depicted into the page (shown as a dot). The directions A1, A2, and A3, and plane A4, are used throughout several of the various views of the implementations described throughout the figures for simplicity. The image sensor die includes a first surface 116 and a second surface 118. The first surface 116 defines an active region 108 of the image sensor die 104. The transparent member 106 includes a first surface 126 and a second surface 128.

The gap height 105 is the height of the air gap 103. The air gap 103 may be empty space (e.g., devoid of components). The gap height 105 is the distance between the active region 108 of the image sensor die 104 and the transparent member 106 in the direction A1. In some examples, the gap height 105 is the distance between the second surface 128 of the transparent member 106 and the first surface 116 of the image sensor die 104 in the direction A1. According to the techniques described herein, the gap height 105 can be defined in a relatively precise manner in order to meet a desired designed specification. Also, in some examples, the gap height 105 can be increased to provide a relatively larger air gap 103, which may be beneficial for some applications.

The transparent member 106 is coupled to the image sensor die 104 via a bonding material 124 and pillar members 125. The height of the pillar members 125 may define the gap height 105 and may assist with ensuring a relatively precise gap height 105. For example, each pillar member 125 includes a first end 141 and a second end 143. The distance between the first end 141 and the second end 143 in the direction A1 may define the height of a respective pillar member 125. The first end 141 may contact (e.g., directly contact) the first surface 116 of the image sensor die 104 (at a region outside of the active region 108). The second end 143 may contact (e.g., directly contact) the second surface 128 of the transparent member 106. In some examples, each pillar member 125 has substantially the same height. In some examples, one or more of the pillar members 125 has a height that is different from one or more other pillar members 125.

Before the bonding material 124 is dispensed, the pillar members 125 are formed on the image sensor die 104. Then, the bonding material 124 is dispensed on the image sensor die 104 (and the pillar members 125). In some examples, the bonding material 124 includes a liquid epoxy resin that is deposited on portions of the image sensor die 104 and the pillar members 125. The pillar members 125 provide a relatively rigid structure that operates as a landing pad to receive the transparent member 106 when the transparent member 106 is placed (e.g., dropped) on the bonding material 124. For example, the transparent member 106 is placed in contact with the bonding material 124, where the relatively rigid structure of the pillar members 125 holds the transparent member 106 at a fixed location (defined by the height of the pillar members 125) while the bonding material 124 (e.g., the liquid epoxy resin) is cured in order to couple the image sensor die 104 to the transparent member 106.

If the image sensor package 100 did not include the pillar members 125, and, when the transparent member 106 is dropped on top of the image sensor die 104, the transparent member 106 may sink into the relatively soft bonding material 124, thereby causing a relatively imprecise gap height 105. However, according to the techniques described herein, when the transparent member 106 is placed (e.g. dropped) on top of the image sensor die 104, the relatively rigid structure of the pillar members 125 causes the transparent member 106 to be positioned away from the active region 108 of the image sensor die 104 by the height of the pillar members 125, which corresponds to the gap height 105. This leads to a more precise gap height 105.

As shown in FIG. 1B, the pillar members 125 are formed on a mount area 123 of the first surface 116 of the image sensor die 104. The mount area 123 may be outside of the active region 108. In some examples, the active region 108 has a rectangular shape. In some examples, the active region 108 has a square shape. The mount area 123 is the space adjacent to a perimeter 109 of the active region 108. The area inside of the perimeter 109 of the active region 108 corresponds to or defines pixel elements configured to convert electromagnetic radiation (e.g., light) to electrical signals. In some examples, the mount area 123 is the space on the first surface 116 between the perimeter 109 of the active region 108 and contact terminals 117. The contact terminals 117 may be the exposed conductive pads that are configured to be coupled to another component (e.g., the substrate 102). In some examples, the contact terminals 117 are aligned in a row proximate to each edge of the image sensor die 104. Since the image sensor die 104 includes four edges, there are four aligned rows of contact terminals 117. Bond wires 122 may be connected to one or more of the contact terminals 117 and the substrate 102.

Each pillar member 125 is a separate structure that extends from the mount area 123 on the first surface 116 of the image sensor die 104 in the direction A1. In some examples, the pillar members 125 are spaced apart from each other on the mount area 123. In some examples, a particular pillar member 125 is disposed on a separate corner portion of the mount area 123. In some examples, each pillar member 125 is disposed on a portion of the mount area 123 at a location proximate to a separate corner of the active region 108. In some examples, each pillar member 125 has an L-shape.

In some examples, each pillar member 125 includes a first linear portion 131 and a second linear portion 133. The second linear portion 133 extends from the first linear portion 131. The second linear portion 133 is disposed at a non-zero angle with respect to the first linear portion 131. In some examples, the second linear portion 133 is perpendicular to the first linear portion 131. The first linear portion 131 has a length that extends in the direction A2, a width that extends in the direction A3, and a height that extends in the direction A1. The second linear portion 133 has a length that extends in the direction A3, a width that extends in the direction A2, and a height that extends in the direction A1.

In some examples, each pillar member 125 has the same shape with respect to each other. In some examples, one or more pillar members 125 has a shape that is different from one or more other pillar members 125. In some examples, the pillar members 125 may encompass other shapes (e.g., besides the L-shape) such as a single linear shape, a shape having one or more curved or bent portions and/or one or more linear portions, a T-shape, or generally any type of shape that extends in the direction A1.

In some examples, the pillar members 125 are formed with a bonding material (e.g., adhesive, epoxy resin, etc.). In some examples, the pillar members 125 are formed by dispensing a liquid epoxy resin on the image sensor die 104, and then curing the liquid epoxy resin to form the pillar members 125. In some examples, the liquid epoxy resin is cured using UV light. In some examples, the pillar members 125 are formed with a conductive material (e.g., Au, Cu, Ni, Al, etc.). In some examples, the pillar members 125 are formed by creating conductive members (e.g., metal bumps) using a lithography and plating process.

As shown in FIG. 1C, after the pillar members 125 are formed, the bonding material 124 is dispensed on the mount area 123 of the image sensor die 104, thereby covering the pillar members 125. In some examples, the bonding material 124 includes a liquid epoxy resin. In some examples, the amount of liquid epoxy resin used for the bonding material 124 is greater than the amount of liquid epoxy resin used to create the pillar members 125. In some examples, the liquid epoxy resin used for the bonding material 124 is applied to a greater surface area than the liquid epoxy resin used to create the pillar members 125.

After the bonding material 124 (e.g., the liquid epoxy resin) is dispensed, the transparent member 106 is placed in contact with the bonding material 124 (e.g., the liquid epoxy resin) and the pillar members 125. For example, at this point, since the bonding material 124 is relatively soft (e.g., not cured), the transparent member 106 may sink into the bonding material 124 until the second surface 128 of the transparent member 106 contacts the pillar members 125. Then, the bonding material 124 (e.g., the liquid epoxy resin) is cured to couple the transparent member 106 to the image sensor die 104 while the pillar members 125 hold the transparent member 106 at the desired distance away from the active region 108.

In some examples, the bonding material 124 is disposed on the mount area 123 around the active region 108. In some examples, the bonding material 124 is disposed around a perimeter portion of the mount area 123 (thereby forming a closed loop). In some examples, the bonding material 124 defines an inner perimeter 111 and an outer perimeter 113. The pillar members 125 are disposed at a location between the inner perimeter 111 and the outer perimeter 113. In some examples, the bonding material 124 covers the pillar members 125. In some examples, a portion of the bonding material 124 contacts the second end 143 of the pillar members 125. The inner perimeter 111 may define an inner edge of the bonding material 124. The outer perimeter 113 may define an outer edge of the bonding material 124. The bonding material 124 extends between the inner perimeter 111 and the outer perimeter 113. The outer perimeter 113 may have a length that is larger than the inner perimeter 111. The inner perimeter 111 may form a closed loop around the active region 108. The inner perimeter 111 may be disposed a distance away from the perimeter 109 of the active region 108 in the directions A2 and A3. For example, an empty space may exist between the perimeter 109 and the inner perimeter 111. The outer perimeter 113 may form a closed loop around the active region 108. The outer perimeter 113 is disposed a distance away from the contact terminals 117. For example, an empty space may exist between the contact terminals 117 and the outer perimeter 113.

The substrate 102 includes a printed circuit board (PCB) substrate. In some examples, the substrate 102 includes a dielectric material. In some examples, the substrate 102 includes a single layer of PCB base material. In some examples, the substrate 102 includes multiple layers of PCB base material. In some examples, the substrate 102 includes one or more conductive layer portions (e.g., electrical traces) disposed on the first surface 112 of the substrate 102, and/or one or more conductive layer portions (e.g., electrical traces) disposed on the second surface 114 of the substrate 102. In some examples, the electrical traces may be configured to and/or used to transmit signals to and/or from devices (e.g., electronic devices included in a semiconductor region (e.g., epitaxial layer and/or semiconductor substrate)) connected to the electrical traces. In some examples, the electrical traces can include conductive traces (e.g., metallic traces) such as copper traces, aluminum traces, and/or so forth.

The image sensor die 104 may include a complementary metal-oxide semiconductor (CMOS) image sensor. In some examples, the first surface 116 (and/or the second surface 118) is parallel to the first surface 112 (and/or the second surface 114). The image sensor die 104 defines the active region 108 on the first surface 116 of the image sensor die 104. The active region 108 may have or correspond with, an array of pixel elements configured to convert electromagnetic radiation (e.g., light) to electrical signals.

The image sensor die 104 is coupled to the substrate 102. For example, the second surface 118 of the image sensor die 104 may be coupled to the first surface 112 of the substrate 102 using one or more bonding materials (e.g., an adhesive layer, die attach film, polymer-based material, an epoxy resin, etc.) in order to physically couple the image sensor die 104 to the substrate 102. In some examples, the bond wires 122 are connected to the image sensor die 104 and the substrate 102 in order to communicatively couple the image sensor die 104 to the substrate 102. The bond wires 122 may include conductive (e.g., metal) wires such as aluminum, copper, or gold, or any combination thereof, for example. In some examples, the image sensor die 104 is coupled to the substrate 102 in a flip-chip configuration. In some examples, the image sensor die 104 is coupled to the substrate 102 by surface mount technology (SMT) (e.g., interconnection by solder joint). In some examples, the image sensor die 104 is coupled to the first surface 112 of the substrate 102 using one or more bump members (e.g., copper pillars with solder, gold plated bumps, solder bumps, and/or gold stud bumps, etc.). In some examples, an under-fill material is disposed within the gap between the image sensor die 104 and the substrate 102, where the under-fill material encapsulates the bump members.

The transparent member 106 is coupled to the image sensor die 104 such that the transparent member 106 is positioned over (and spaced apart from) the active region 108 on the first surface 116 of the image sensor die 104 in the direction A1. In some examples, the first surface 126 (and/or the second surface 128) is parallel to the first surface 116 (and/or the second surface 118). The transparent member 106 includes an optically transparent material that allows electromagnetic radiation (e.g., light (e.g., visible light)) to pass through (e.g., pass through the entirety of the material). In some examples, the transparent member 106 includes an optically transparent material that allows the transmission of light waves without being scattered (or being scattered to a relatively small or negligible degree). In some examples, the transparent member 106 includes a cover. In some examples, the transparent member 106 includes a lid. In some examples, the transparent member 106 includes one or more organic materials and/or one or more inorganic materials. In some examples, the transparent member 106 includes a glass material. In some examples, the transparent member 106 is a glass substrate. In some examples, the transparent member 106 includes one or more layers of transparent material.

The image sensor package 100 includes an encapsulation material 130 configured to encapsulate one or more components of the image sensor package 100. In some examples, the encapsulation material 130 is formed from a liquid encapsulation. In some examples, the encapsulation material 130 includes a molding material. The encapsulation material 130 includes one or more types of material (e.g., in a molding compound if including multiple types of materials) such as a metal, a plastic, a resin, an epoxy, a phenolic hardener, a silica material, a pigment, a glass, a ceramic casing, and/or so forth. The encapsulation material 130 may encapsulate the bond wires 122. The encapsulation material 130 may be disposed on the first surface 112 of the substrate 102 at locations adjacent to the image sensor die 104. The encapsulation material 130 may extend along an edge of the image sensor die 104, the bonding material 124, and/or an edge of the transparent member 106.

Figure 2A:
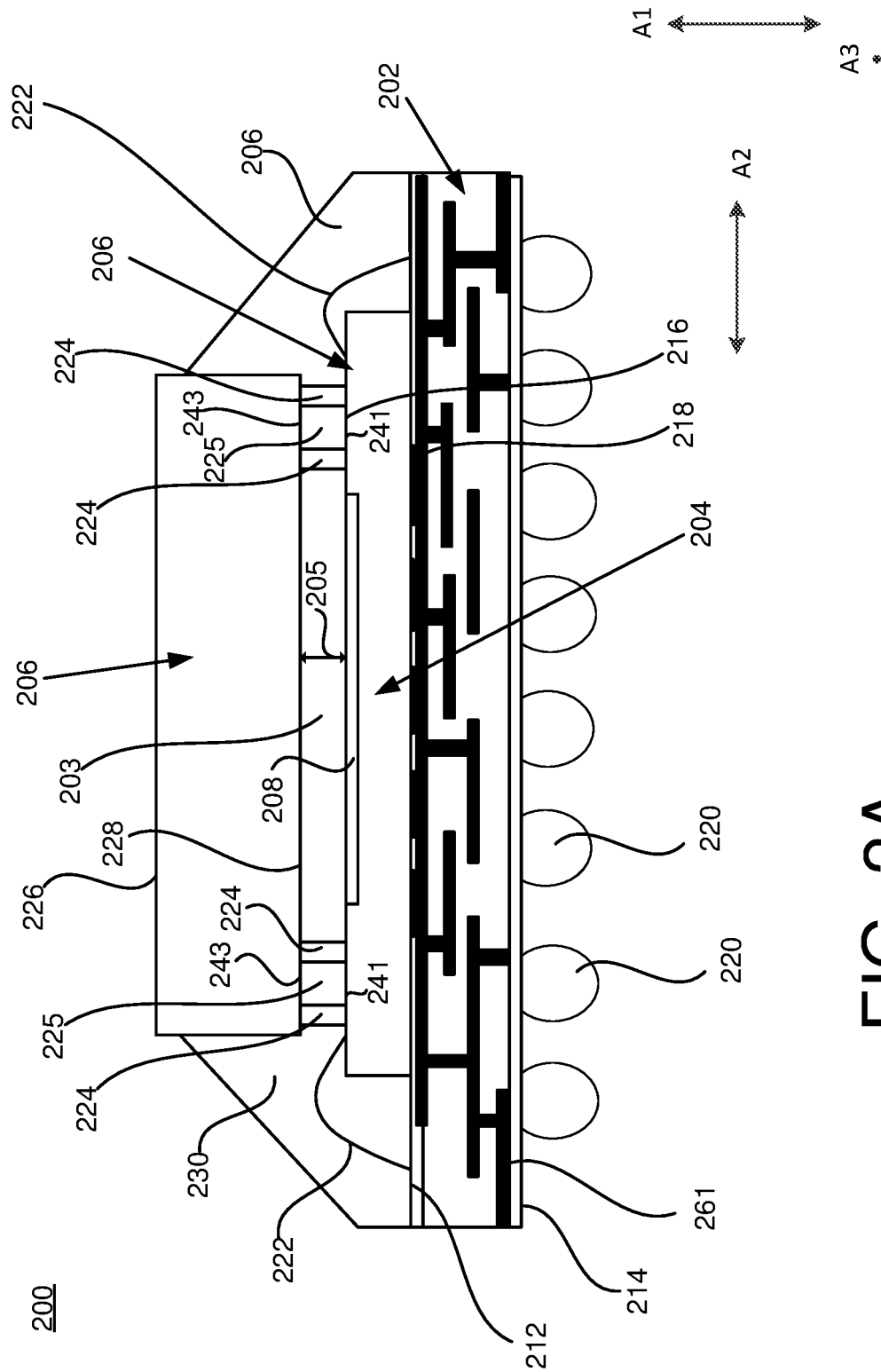
FIGS. 2A through 2C illustrate an image sensor package according to an aspect.
Figure 2C:
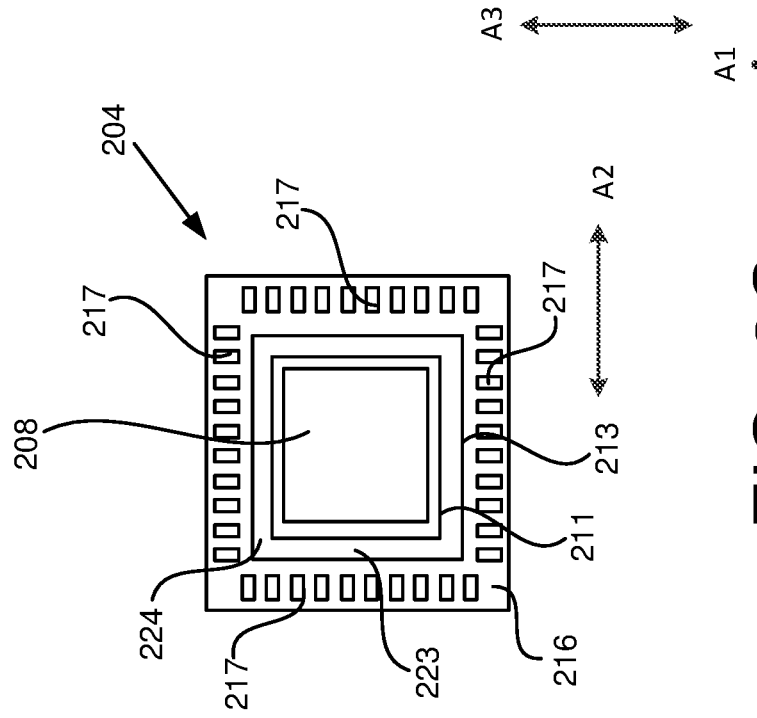
Figure 2B:
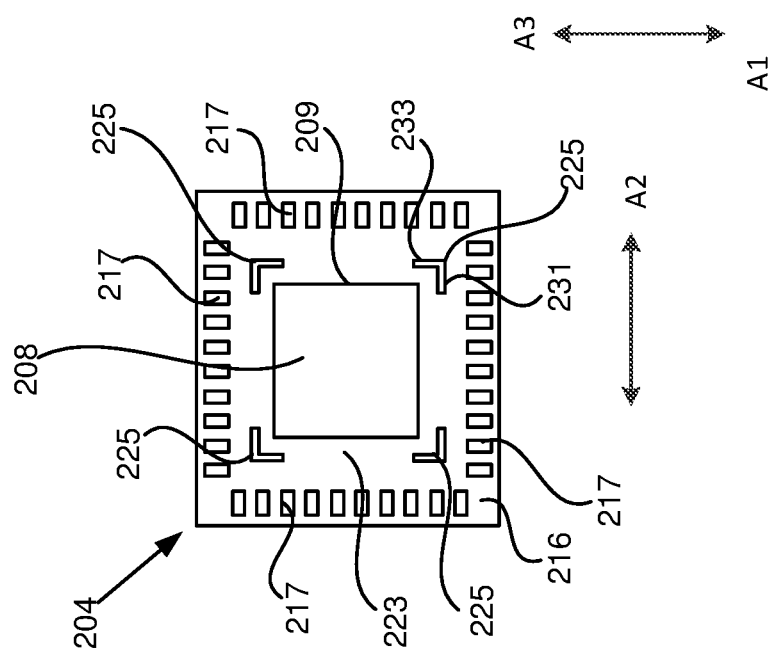

FIGS. 2A through 2C illustrate an image sensor package 200 according to an aspect. In some examples, the image sensor package 200 includes a complementary metal-oxide-semiconductor (CMOS) image sensor (CIS) package. The image sensor package 200 may include any of the features described with respect to the image sensor package 100 of FIGS. 1A through 1C. The image sensor package 200 includes a substrate 202, an image sensor die 204 coupled to the substrate 202, and a transparent member 206 coupled to the image sensor die 204 such that an air gap 203 (e.g., empty space) exists between an active region 208 of the image sensor die 204 and the transparent member 206.

The substrate 202 includes a first surface 212 and a second surface 214. The first surface 212 of the substrate 202 is disposed in a plane A4. In some examples, the second surface 214 is disposed in parallel with the first surface 212. A direction A1 is aligned perpendicular to the plane A4, and a direction A2 is perpendicular to the direction A1. A direction A3 is aligned parallel to the plane A4 and is orthogonal to directions A1 and A2. As shown in FIG. 2A, the direction A3 is depicted into the page (shown as a dot). FIG. 2A depicts a side view of the image sensor package 200. FIGS. 2B and 2C depict a top view of the image sensor die 204. For example, FIG. 2B illustrates the image sensor die 204 with pillar members 225 disposed at corner portions of a mount area 223 before a bonding material 224 is applied. FIG. 2C illustrates the image sensor die 204 with the bonding material 224 applied to the mount area 223, where the bonding material 224 covers the pillar members 225.

Since FIGS. 2B and 2C depict a different orientation than FIG. 2A, the direction A1 is depicted into the page (shown as a dot). The directions A1, A2, and A3, and plane A4, are used throughout several of the various views of the implementations described throughout the figures for simplicity. The image sensor die includes a first surface 216 and a second surface 218. The first surface 216 defines an active region 208 of the image sensor die 204. The transparent member 206 includes a first surface 226 and a second surface 228.

The gap height 205 is the height of the air gap 203. The air gap 203 may be empty space (e.g., devoid of components). The gap height 205 is the distance between the active region 208 of the image sensor die 204 and the transparent member 206 in the direction A1. In some examples, the gap height 205 is the distance between the second surface 228 of the transparent member 206 and the first surface 216 of the image sensor die 204 in the direction A1. According to the techniques described herein, the gap height 205 can be defined in a relatively precise manner in order to meet a desired designed specification. Also, in some examples, the gap height 205 can be increased to provide a relatively larger air gap 203, which may be beneficial for some applications.

The transparent member 206 is coupled to the image sensor die 204 via a bonding material 224 and pillar members 225. The height of the pillar members 225 may define the gap height 205 and may assist with ensuring a relatively precise gap height 205. For example, each pillar member 225 includes a first end 241 and a second end 243. The distance between the first end 241 and the second end 243 in the direction A1 may define the height of a respective pillar member 225. The first end 241 may contact (e.g., directly contact) the first surface 216 of the image sensor die 204 (at a region outside of the active region 208). The second end 243 may contact (e.g., directly contact) the second surface 228 of the transparent member 206. In some examples, each pillar member 225 has substantially the same height. In some examples, one or more of the pillar members 225 has a height that is different from one or more other pillar members 225.

Before the bonding material 224 is dispensed, the pillar members 225 are formed on the image sensor die 204. Then, the bonding material 224 is dispensed on the image sensor die 204 and the pillar members 225. In some examples, the bonding material 224 includes a liquid epoxy resin that is deposited on portions of the image sensor die 204 and the pillar members 225. The pillar members 225 provide a relatively rigid structure that operates as a landing pad to receive the transparent member 206 when the transparent member 206 is placed (e.g., dropped) on the bonding material 224. For example, the transparent member 206 is placed in contact with the bonding material 224, where the relatively rigid structure of the pillar members 225 holds the transparent member 206 at a fixed location (defined by the height of the pillar members 225) while the bonding material 224 (e.g., the liquid epoxy resin) is cured in order to couple the image sensor die 204 to the transparent member 206.

If the image sensor package 200 did not include the pillar members 225, and, when the transparent member 206 is dropped on top of the image sensor die 204, the transparent member 206 may sink into the relatively soft bonding material 224, thereby causing a relatively unprecise gap height 205. However, according to the techniques described herein, when the transparent member 206 is placed (e.g. dropped) on top of the image sensor die 204, the relatively rigid structure of the pillar members 225 causes the transparent member 206 to be positioned away from the active region 208 of the image sensor die 204 by the height of the pillar members 225, which corresponds to the gap height 205. This leads to a more precise gap height 205.

As shown in FIG. 2B, the pillar members 225 are formed on a mount area 223 of the first surface 216 of the image sensor die 204. The mount area 223 may be outside of the active region 208. In some examples, the active region 208 has a rectangular shape. In some examples, the active region 208 has a square shape. In some examples, the mount area 223 is the space adjacent to a perimeter 209 of the active region 208. The area inside of the perimeter 209 of the active region 208 corresponds to or defines pixel elements configured to convert electromagnetic radiation (e.g., light) to electrical signals. In some examples, the mount area 223 is the space on the first surface 216 between the perimeter 209 of the active region 208 and contact terminals 217. The contact terminals 217 may be the exposed conductive pads that are configured to be coupled to another component (e.g., the substrate 202). In some examples, the contact terminals 217 are aligned in a row proximate to each edge of the image sensor die 204. Since the image sensor die 204 includes four edges, there are four aligned rows of contact terminals 217. Bond wires 222 may be connected to one or more of the contact terminals 217 and the substrate 202.

Each pillar member 225 is a separate structure that extends from the mount area 223 on the first surface 216 of the image sensor die 204 in the direction A1. In some examples, the pillar members 225 are spaced apart from each other on the mount area 223. In some examples, a particular pillar member 225 is disposed on a separate corner portion of the mount area 223. In some examples, each pillar member 225 is disposed on a portion of the mount area 223 at a location proximate to a separate corner of the active region 208. In some examples, each pillar member 225 has an L-shape.

In some examples, each pillar member 225 includes a first linear portion 231 and a second linear portion 233. The second linear portion 233 extends from the first linear portion 231. The second linear portion 233 is disposed at a non-zero angle with respect to the first linear portion 231. In some examples, the second linear portion 233 is perpendicular to the first linear portion 231. The first linear portion 231 has a length that extends in the direction A2, a width that extends in the direction A3, and a height that extends in the direction A1. The second linear portion 233 has a length that extends in the direction A3, a width that extends in the direction A2, and a height that extends in the direction A1.

In some examples, each pillar member 225 has the same shape with respect to each other. In some examples, one or more pillar members 225 has a shape that is different from one or more other pillar members 225. In some examples, the pillar members 225 may encompass other shapes (e.g., besides the L-shape) such as a single linear shape, a shape having one or more curved or bent portions and/or one or more linear portions, a T-shape, or generally any type of shape that extends in the direction A1.

In some examples, the pillar members 225 are formed with a bonding material (e.g., adhesive, epoxy resin, etc.). In some examples, the pillar members 225 are formed by dispensing a liquid epoxy resin on the image sensor die 204, and then curing the liquid epoxy resin to form the pillar members 225. In some examples, the liquid epoxy resin is cured using UV light. In some examples, the pillar members 225 are formed with a conductive material (e.g., Au, Cu, Ni, Al, etc.). In some examples, the pillar members 225 are formed by creating conductive members (e.g., metal bumps) using a lithography and plating process.

As shown in FIG. 2C, after the pillar members 225 are formed, the bonding material 224 is dispensed on the mount area 223 of the image sensor die 204, thereby covering the pillar members 225. In some examples, the bonding material 224 includes a liquid epoxy resin. In some examples, the amount of liquid epoxy resin used for the bonding material 224 is greater than the amount of liquid epoxy resin used to create the pillar members 225. In some examples, the liquid epoxy resin used for the bonding material 224 is applied to a greater surface area than the liquid epoxy resin used to create the pillar members 225.

After the bonding material 224 (e.g., the liquid epoxy resin) is dispensed, the transparent member 206 is placed in contact with the bonding material 224 (e.g., the liquid epoxy resin) and the pillar members 225. For example, at this point, since the bonding material 224 is relatively soft (e.g., not cured), the transparent member 206 may sink into the bonding material 224 until the second surface 228 of the transparent member 206 contacts the pillar members 225. Then, the bonding material 224 (e.g., the liquid epoxy resin) is cured to couple the transparent member 206 to the image sensor die 204 while the pillar members 225 hold the transparent member 206 at the desired distance away from the active region 208.

In some examples, the bonding material 224 is disposed on the mount area 223 around the active region 208. In some examples, the bonding material 224 is disposed around a perimeter portion of the mount area 223 (thereby forming a closed loop). In some examples, the bonding material 224 defines an inner perimeter 211 and an outer perimeter 213. The pillar members 225 are disposed at a location between the inner perimeter 211 and the outer perimeter 213. In some examples, the bonding material 224 covers the pillar members 225. In some examples, a portion of the bonding material 224 contacts the second end 243 of the pillar members 225. The inner perimeter 211 may define an inner edge of the bonding material 224. The outer perimeter 213 may define an outer edge of the bonding material 224. The bonding material 224 extends between the inner perimeter 211 and the outer perimeter 213. The outer perimeter 213 may have a length that is larger than the inner perimeter 211. The inner perimeter 211 may form a closed loop around the active region 208. The inner perimeter 211 may be disposed a distance away from the perimeter 209 of the active region 208 in the directions A2 and A3. For example, an empty space may exist between the perimeter 209 and the inner perimeter 211. The outer perimeter 213 may form a closed loop around the active region 208. The outer perimeter 213 is disposed a distance away from the contact terminals 217. For example, an empty space may exist between the contact terminals 217 and the outer perimeter 213.

The substrate 202 includes a printed circuit board (PCB) substrate. In some examples, the substrate 202 includes a dielectric material. In some examples, the substrate 202 includes a single layer of PCB base material. In some examples, the substrate 202 includes multiple layers of PCB base material. The substrate 202 includes a first surface 212 and a second surface 214 that is disposed opposite to the first surface 212. In some examples, the substrate 202 includes electrical traces 261. The electrical traces 261 may include one or more conductive layer portions disposed on the first surface 212 of the substrate 202, one or more conductive layer portions (e.g., electrical traces) disposed on the second surface 214 of the substrate 202, and/or one or more conductive layer portions embedded within the substrate 202.

The image sensor package 200 may include one or more conductive components 220 coupled to the second surface 214 of the substrate 202. In some examples, the conductive components 220 are surface-mount packaging elements. In some examples, the conductive components 220 include solder balls. The conductive components 220 are components used to connect to an external device (e.g., a ball grid array (BGA) device). However, the conductive components 220 may include other types of surface-mount packaging elements.

The image sensor die 204 may include a complementary metal-oxide semiconductor (CMOS) image sensor. In some examples, the first surface 216 (and/or the second surface 218) is parallel to the first surface 212 (and/or the second surface 214). The image sensor die 204 defines the active region 208 on the first surface 216 of the image sensor die 204. The active region 208 may have or correspond with, an array of pixel elements configured to convert electromagnetic radiation (e.g., light) to electrical signals.

The image sensor die 204 is coupled to the substrate 202. For example, the second surface 218 of the image sensor die 204 may be coupled to first surface 212 of the substrate 202 using one or more bonding materials (e.g., an adhesive layer, die attach film, polymer-based material, an epoxy resin, etc.) in order to physically couple the image sensor die 204 to the substrate 202. In some examples, the bond wires 222 are connected to the image sensor die 204 and the substrate 202 in order to communicatively couple the image sensor die 204 to the substrate 202. The bond wires 222 may include conductive (e.g., metal) wires such as aluminum, copper, or gold, or any combination thereof, for example. In some examples, the image sensor die 204 is coupled to the substrate 202 in a flip-chip configuration. In some examples, the image sensor die 204 is coupled to the substrate 202 by surface mount technology (SMT) (e.g., interconnection by solder joint). In some examples, the image sensor die 204 is coupled to the first surface 212 of the substrate 202 using one or more bump members (e.g., copper pillars with solder, gold plated bumps, solder bumps, and/or gold stud bumps, etc.). In some examples, an under-fill material is disposed within the gap between the image sensor die 204 and the substrate 202, where the under-fill material encapsulates the bump members.

The transparent member 206 is coupled to the image sensor die 204 such that the transparent member 206 is positioned over (and spaced apart from) the active region 208 on the first surface 216 of the image sensor die 204 in the direction A1. In some examples, the first surface 226 (and/or the second surface 228) is parallel to the first surface 216 (and/or the second surface 218). The transparent member 206 includes an optically transparent material that allows electromagnetic radiation (e.g., light (e.g., visible light)) to pass through (e.g., pass through the entirety of the material). In some examples, the transparent member 206 includes a glass material.

The image sensor package 200 includes an encapsulation material 230 configured to encapsulate one or more components of the image sensor package 200. In some examples, the encapsulation material 230 is formed from a liquid encapsulation. In some examples, the encapsulation material 230 includes a molding material. The encapsulation material 230 may encapsulate the bond wires 222. The encapsulation material 230 may be disposed on the first surface 212 of the substrate 202 at locations adjacent to the image sensor die 204. The encapsulation material 230 may extend along an edge of the image sensor die 204, an edge of the bonding material 224, and/or an edge of the transparent member 206.

FIGS. 3A through 3M depict a flowchart depicting example fabrication operations for manufacturing an image sensor package according to an aspect. Although the flowchart is described with reference to the image sensor package 100 of FIGS. 1A through 1C, the flowchart may be applicable to any of the sensor packaging packages discussed herein. Although the flowchart of FIGS. 3A through 3M illustrate operations in sequential order, it will be appreciated that this is merely an example, and that additional or alternative operations may be included. Further, operations of FIGS. 3A through 3M and related operations may be executed in a different order than that shown, or in a parallel or overlapping fashion.

FIGS. 3A and 3B depict operation 302. In operation 302, a substrate 102 is provided. The substrate 102 may include conductive traces 161. FIG. 3A illustrates a side view of the substrate 102. FIG. 3B illustrates a top view of the substrate 102. FIGS. 3C and 3D depict operation 304. In operation 304, an image sensor die 104 is coupled to the substrate 102, and bond wires 122 are connected to the image sensor die 104 and the substrate 102. FIG. 3C illustrates a side view of the image sensor die 104 and the substrate 102. FIG. 3D illustrates a top view of the image sensor die 104 and the substrate 102. In operation 304, the image sensor die 104 is coupled to the substrate 102 using a die attach film, and the bond wires 122 are connected to the contact terminals 117 on the image sensor die 104 and the substrate 102.

FIGS. 3E and 3F depict operation 306. In operation 306, pillar members 125 are formed on a mount area 123 of the image sensor die 104. FIG. 3E illustrates a side view of the image sensor package. FIG. 3F illustrates a top view of the image sensor package. In operation 306, a dispenser 150 dispenses a liquid epoxy resin on the corner portions of the mount area 123 to create the pillar members 125.

FIGS. 3H and 3I depict operation 308. In operation 308, UV light 152 is applied to the liquid epoxy resin to cure the liquid epoxy resin to harden the pillar members 125. FIG. 3H illustrates a side view of the image sensor package. FIG. 3I illustrates a top view of the image sensor package.

FIGS. 3J and 3K depict operation 310. In operation 310, the dispenser 150 dispenses the bonding material 124 on the mount area 123 of the image sensor die 104. FIG. 3J illustrates a side view of the image sensor package. FIG. 3K illustrates a top view of the image sensor package.

Figure 3N:
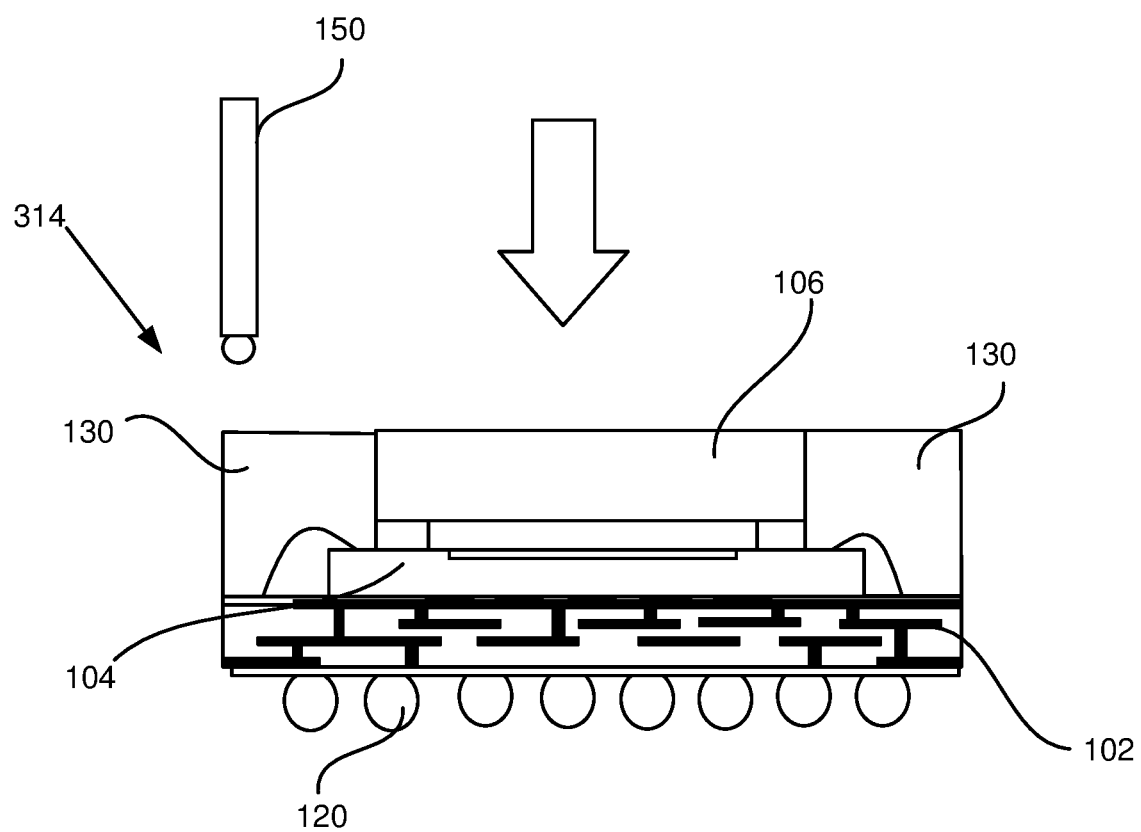

FIGS. 3L and 3M depict operation 312. In operation 312, the transparent member 106 is placed on the bonding material 124 and the pillar members, and UV light 152 is applied to the bonding material 124 to couple the transparent member 106 to the image sensor die 104. FIG. 3N depicts operation 314. In operation 314, the dispenser 150 dispenses an encapsulation material 130 to the substrate 102, and conductive components 120 coupled to the substrate 102.

Figure 4:
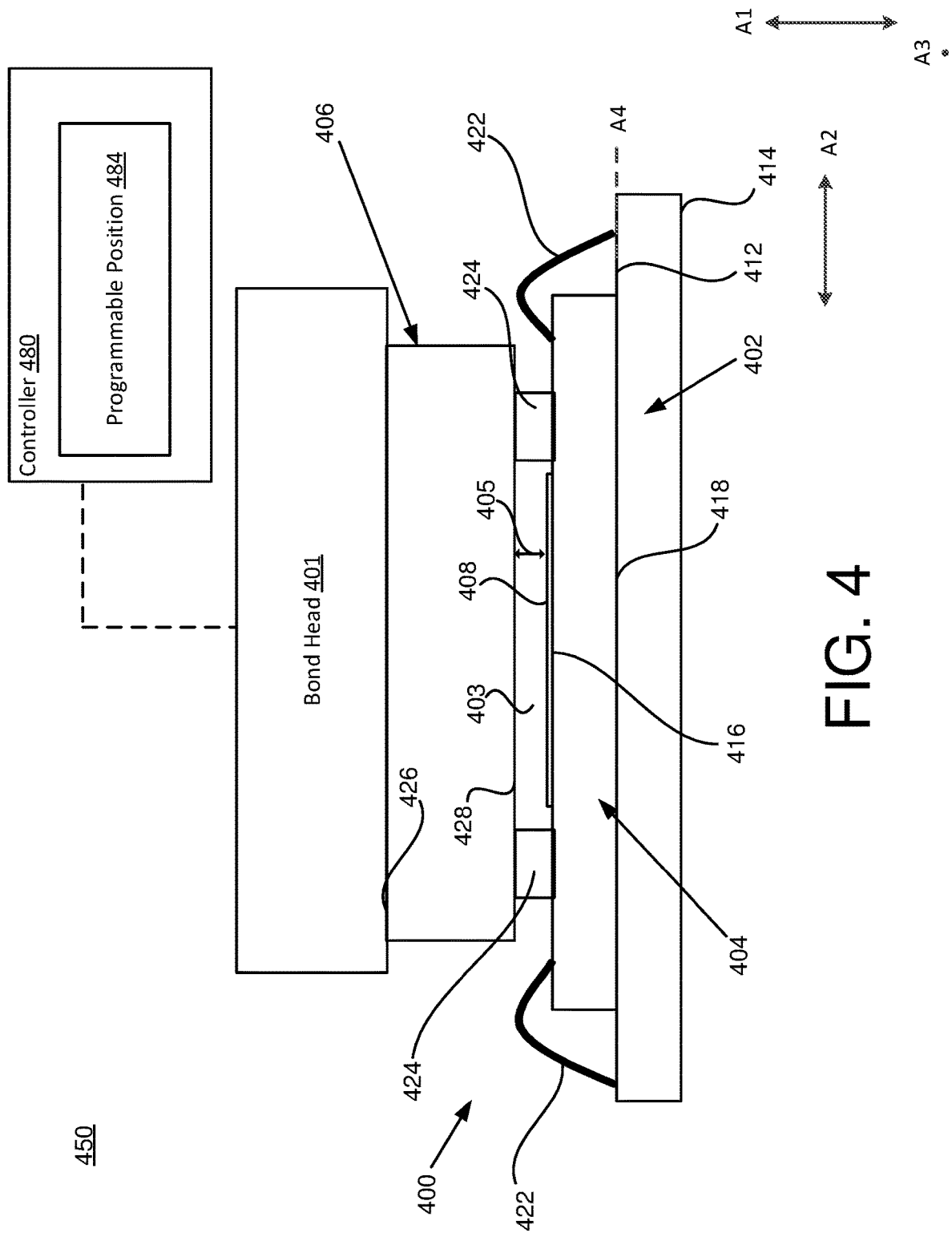
FIG. 4 illustrates an image sensor package configured to be fabricated in a manner that permits a gap height to be controlled according to an aspect.

FIG. 4 illustrate a system 450 for defining a gap height 405 within an image sensor package 400 according to an aspect. In some examples, the image sensor package 400 includes a complementary metal-oxide-semiconductor (CMOS) image sensor (CIS) package. The image sensor package 400 may include any of the features described with respect to the previous figures. The image sensor package 400 includes a substrate 402, an image sensor die 404 coupled to the substrate 202, and a transparent member 406 coupled to the image sensor die 404 such that an air gap 403 (e.g., empty space) exists between an active region 408 of the image sensor die 404 and the transparent member 406.

The substrate 402 includes a first surface 412 and a second surface 414. The first surface 412 of the substrate 402 is disposed in a plane A4. In some examples, the second surface 414 is disposed in parallel with the first surface 412. A direction A1 is aligned perpendicular to the plane A4, and a direction A2 is perpendicular to the direction A1. A direction A3 is aligned parallel to the plane A4 and is orthogonal to directions A1 and A2. As shown in FIG. 4, the direction A3 is depicted into the page (shown as a dot). The directions A1, A2, and A3, and plane A4, are used throughout several of the various views of the implementations described throughout the figures for simplicity. The image sensor die 404 includes a first surface 416 and a second surface 418. The first surface 416 defines an active region 408 of the image sensor die 404. The transparent member 406 includes a first surface 426 and a second surface 428.

The gap height 405 is the height of the air gap 403. The air gap 403 may be empty space (e.g., devoid of components). The gap height 405 is the distance between the active region 408 of the image sensor die 404 and the transparent member 406 in the direction A1. In some examples, the gap height 405 is the distance between the second surface 428 of the transparent member 406 and the first surface 416 of the image sensor die 404 in the direction A1. According to the techniques described herein, the gap height 405 can be defined in a relatively precise manner in order to meet a desired designed specification. Also, in some examples, the gap height 405 can be increased to provide a relatively larger air gap 403, which may be beneficial for some applications.

In order to couple the transparent member 406 to the image sensor die 401, a bonding material 424 is dispensed on a mount area of the image sensor die 404. In some examples, the bonding material 424 includes a liquid epoxy resin that is dispensed on the mount area of the image sensor die 404. Then, the transparent member 406 is coupled to a bond head 401. The bond head 401 may be a movable device that uses vacuum suction to couple the transparent member 406 to the bond head 401. For example, activation of the vacuum suction on the bond head 401 causes the transparent member 406 to contact and remain attached to the bond head 401. Then, the bond head 401 is moved to a programmable position 484 to place the transparent member 406 in contact with the bonding material 424. The programmable position 484 defines the gap height 405 between the active region 408 and the transparent member 406. For example, the programmable position 484 may define the location and the height of the bond head 401, which defines the gap height 405. After the bond head 401 is moved to the programmable position 484, the bonding material 424 is curved to form a solid material. In some examples, the bonding material 424 is curved using UV light.

The bond head 401 may be communicatively coupled to a controller 480. The controller 480 may include one or more processors (e.g., microprocessors) that execute instructions to control the movement of the bond head 401. In some examples, the bond head 401 and the controller 480 are included as part of a single integrated device. In some examples, the controller 480 is a device separate from the bond head 401, where the controller 480 is connected to the bond head 401 via one or more communication lines (or connected via wireless communication). The programmable position 484 (to which the bond head 401 moves to) may be reprogrammed by a user. For example, the programmable position 484 may be reprogrammed to increase the gap height 405 between the active region 408 of the image sensor die 404 and the transparent member 406. In some examples, the programmable position 484 may be programmed such that the gap height 405 is relatively large. In some examples, the gap height 405 is equal to or greater than 0.5 millimeters (mm). In some examples, the gap height 405 is equal to or greater 0.7 mm. In some examples, the gap height 405 is equal to or greater 0.1 mm. In some examples, when the gap height 405 is relatively large, the bonding material 424 may be a viscosity greater than a threshold level. In some examples, the threshold level may be greater than 50,000 centipoise (cps).

The substrate 402 includes a printed circuit board (PCB) substrate. In some examples, the substrate 402 includes a dielectric material. In some examples, the substrate 402 includes a single layer of PCB base material. In some examples, the substrate 402 includes multiple layers of PCB base material. The image sensor die 404 may include a complementary metal-oxide semiconductor (CMOS) image sensor. In some examples, the first surface 416 (and/or the second surface 418) is parallel to the first surface 412 (and/or the second surface 414). The image sensor die 404 defines the active region 408 on the first surface 416 of the image sensor die 404. The active region 408 may have or correspond with, an array of pixel elements configured to convert electromagnetic radiation (e.g., light) to electrical signals.

The image sensor die 404 is coupled to the substrate 402. For example, the second surface 418 of the image sensor die 404 may be coupled to first surface 412 of the substrate 402 using one or more bonding materials (e.g., an adhesive layer, die attach film, polymer-based material, an epoxy resin, etc.) in order to physically couple the image sensor die 404 to the substrate 402. In some examples, the bond wires 422 are connected to the image sensor die 404 and the substrate 402 in order to communicatively couple the image sensor die 404 to the substrate 402. The bond wires 422 may include conductive (e.g., metal) wires such as aluminum, copper, or gold, or any combination thereof, for example. In some examples, the image sensor die 404 is coupled to the substrate 402 in a flip-chip configuration. In some examples, the image sensor die 404 is coupled to the substrate 402 by surface mount technology (SMT) (e.g., interconnection by solder joint). In some examples, the image sensor die 404 is coupled to the first surface 412 of the substrate 202 using one or more bump members (e.g., copper pillars with solder, gold plated bumps, solder bumps, and/or gold stud bumps, etc.). In some examples, an under-fill material is disposed within the gap between the image sensor die 204 and the substrate 202, where the under-fill material encapsulates the bump members.

The transparent member 406 is coupled to the image sensor die 404 such that the transparent member 406 is positioned over (and spaced apart from) the active region 408 on the first surface 416 of the image sensor die 404 in the direction A1. In some examples, the first surface 426 (and/or the second surface 428) is parallel to the first surface 416 (and/or the second surface 418). The transparent member 406 includes an optically transparent material that allows electromagnetic radiation (e.g., light (e.g., visible light)) to pass through (e.g., pass through the entirety of the material). In some examples, the transparent member 406 includes a glass material.

Figure 5:
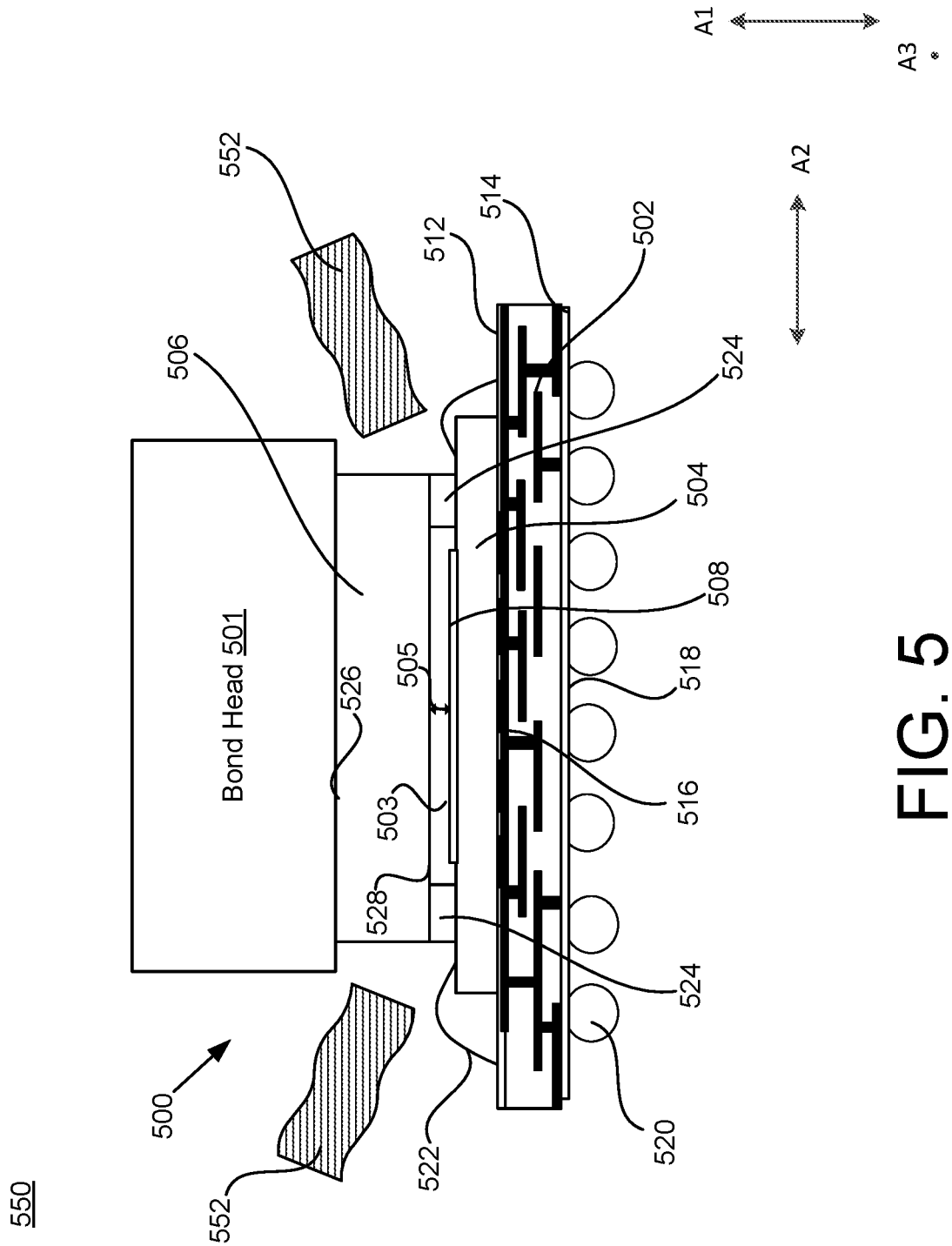
FIG. 5 illustrates an image sensor package according to another aspect.

FIG. 5 illustrates a system 550 for defining a gap height 505 within an image sensor package 500 according to an aspect. In some examples, the image sensor package 500 includes a complementary metal-oxide-semiconductor (CMOS) image sensor (CIS) package. The image sensor package 500 may include any of the features described with respect to the previous figures. The image sensor package 500 includes a substrate 502, an image sensor die 504 coupled to the substrate 202, and a transparent member 506 coupled to the image sensor die 504 such that an air gap 503 (e.g., an empty space) exists between an active region 508 of the image sensor die 504 and the transparent member 506.

The substrate 502 includes a first surface 512 and a second surface 514. The first surface 512 of the substrate 502 is disposed in a plane A4. In some examples, the second surface 514 is disposed in parallel with the first surface 512. A direction A1 is aligned perpendicular to the plane A4, and a direction A2 is perpendicular to the direction A1. A direction A3 is aligned parallel to the plane A4 and is orthogonal to directions A1 and A2. As shown in FIG. 5, the direction A3 is depicted into the page (shown as a dot). The directions A1, A2, and A3, and plane A4, are used throughout several of the various views of the implementations described throughout the figures for simplicity. The image sensor die 504 includes a first surface 516 and a second surface 518. The first surface 516 defines an active region 508 of the image sensor die 504. The transparent member 506 includes a first surface 526 and a second surface 528.

The gap height 505 is the height of the air gap 503. The air gap 503 may be empty space (e.g., devoid of components). The gap height 505 is the distance between the active region 508 of the image sensor die 504 and the transparent member 506 in the direction A1. In some examples, the gap height 505 is the distance between the second surface 528 of the transparent member 506 and the first surface 516 of the image sensor die 504 in the direction A1. According to the techniques described herein, the gap height 505 can be defined in a relatively precise manner in order to meet a desired designed specification. Also, in some examples, the gap height 505 can be increased to provide a relatively larger air gap 503, which may be beneficial for some applications.

In order to couple the transparent member 506 to the image sensor die 501, a bonding material 524 is dispensed on a mount area of the image sensor die 504. In some examples, the bonding material 524 includes a liquid epoxy resin that is dispensed on the mount area of the image sensor die 504. Then, the transparent member 506 is coupled to a bond head 501. The bond head 501 may be a movable device that uses vacuum suction to couple the transparent member 506 to the bond head 501. For example, activation of the vacuum suction on the bond head 501 causes the transparent member 506 to contact and remain attached to the bond head 501. Then, the bond head 501 is moved to a programmable position to place the transparent member 506 in contact with the bonding material 524. The programmable position defines the gap height 505 between the active region 508 and the transparent member 506. For example, the programmable position may define the location and the height of the bond head 501, which defines the gap height 505. After the bond head 501 is moved to the programmable position, the bonding material 524 is curved to form a solid material. In some examples, the bonding material 524 is curved using UV light 552.

The substrate 502 includes a printed circuit board (PCB) substrate. In some examples, the substrate 502 includes a dielectric material. In some examples, the substrate 502 includes a single layer of PCB base material. In some examples, the substrate 502 includes multiple layers of PCB base material. The image sensor die 504 may include a complementary metal-oxide semiconductor (CMOS) image sensor. In some examples, the first surface 516 (and/or the second surface 518) is parallel to the first surface 512 (and/or the second surface 514). The image sensor die 504 defines the active region 508 on the first surface 516 of the image sensor die 504. The active region 508 may have or correspond with, an array of pixel elements configured to convert electromagnetic radiation (e.g., light) to electrical signals.

The image sensor die 504 is coupled to the substrate 502. For example, the second surface 518 of the image sensor die 504 may be coupled to first surface 512 of the substrate 502 using one or more bonding materials (e.g., an adhesive layer, die attach film, polymer-based material, an epoxy resin, etc.) in order to physically couple the image sensor die 504 to the substrate 502. In some examples, the bond wires 522 are connected to the image sensor die 504 and the substrate 502 in order to communicatively couple the image sensor die 504 to the substrate 502. The bond wires 522 may include conductive (e.g., metal) wires such as aluminum, copper, or gold, or any combination thereof, for example. In some examples, the image sensor die 504 is coupled to the substrate 502 in a flip-chip configuration. In some examples, the image sensor die 504 is coupled to the substrate 502 by surface mount technology (SMT) (e.g., interconnection by solder joint). In some examples, the image sensor die 504 is coupled to the first surface 512 of the substrate 202 using one or more bump members (e.g., copper pillars with solder, gold plated bumps, solder bumps, and/or gold stud bumps, etc.). In some examples, an under-fill material is disposed within the gap between the image sensor die 404 and the substrate 202, where the under-fill material encapsulates the bump members.

The transparent member 506 is coupled to the image sensor die 504 such that the transparent member 506 is positioned over (and spaced apart from) the active region 508 on the first surface 516 of the image sensor die 504 in the direction A1. In some examples, the first surface 526 (and/or the second surface 528) is parallel to the first surface 516 (and/or the second surface 518). The transparent member 506 includes an optically transparent material that allows electromagnetic radiation (e.g., light (e.g., visible light)) to pass through (e.g., pass through the entirety of the material). In some examples, the transparent member 406 includes a glass material.

The image sensor package 500 may include one or more conductive components 520 coupled to the second surface 514 of the substrate 502. In some examples, the conductive components 520 are surface-mount packaging elements. In some examples, the conductive components 520 include solder balls. The conductive components 520 are components used to connect to an external device (e.g., a ball grid array (BGA) device). However, the conductive components 520 may include other types of surface-mount packaging elements.

FIGS. 6A through 6F depict a flowchart depicting example fabrication operations for manufacturing an image sensor package according to an aspect. Although the flowchart is described with reference to the image sensor package 400 of FIG. 4, the flowchart may be applicable to any of the sensor packaging packages discussed herein. Although the flowchart of FIGS. 6A through 6F illustrate operations in sequential order, it will be appreciated that this is merely an example, and that additional or alternative operations may be included. Further, operations of FIGS. 6A through 6F and related operations may be executed in a different order than that shown, or in a parallel or overlapping fashion.

Figure 6A:
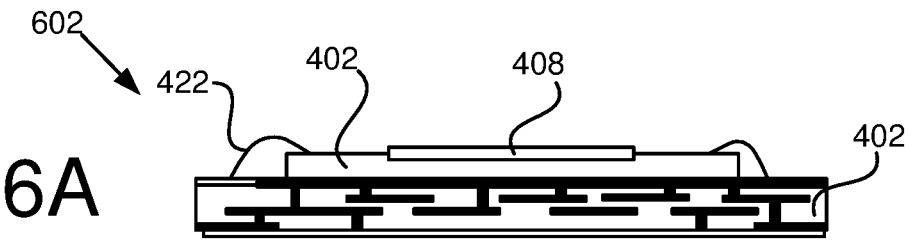

In FIG. 6A, operation 602 includes providing an image sensor die 404 coupled to a substrate 402. The image sensor die 404 includes an active region 408. Bond wires 422 are coupled to the image sensor die 404 and the substrate 402.

Figure 6B:
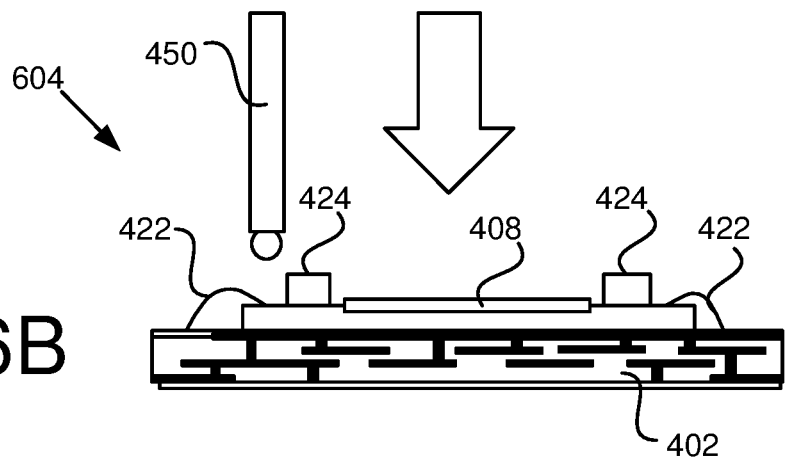
Figure 6C:
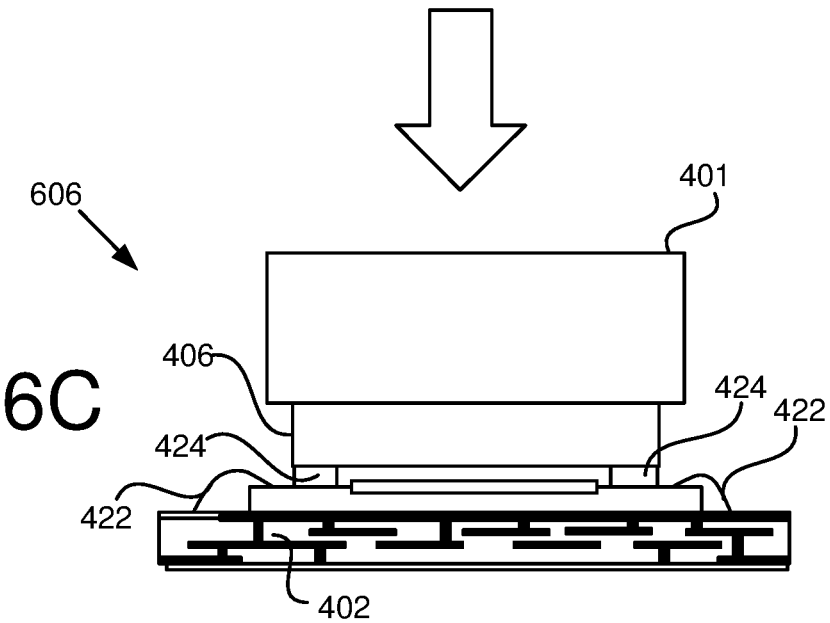

In FIG. 6B, operation 604 includes dispensing bonding material 424 on the image sensor die 404. In FIG. 6C, operation 606 includes moving the bond head 401 coupled to the transparent member 406 to place the transparent member 406 in contact with the bonding material 424. For example, the bond head 401 may be coupled to the transparent member 406, and the bond head 401 is moved to a programmable position in order to define the gap height. In some examples, vacuum suction is activated on the bond head 401 in order to couple the bond head 401 with the transparent member 406. In FIG. 6C, operation 608 includes applying UV light 452 to the bonding material 424 to cure the bonding material 424. For example, the bonding material 424 is cured with the UV light 452 while the bond head 401 is still coupled to the transparent member 406. In this manner, the distance between the image sensor die 404 and the transparent member 406 is remained fixed by the bond head 401 while the relatively soft bonding material 424 is hardened by the UV light 452, thereby providing a relatively precise gap height. In some examples, the bonding material 424 includes a liquid epoxy resin, and the liquid epoxy resin is dispensed on the image sensor die 404. Then, in operation 608, UV light 452 is applied to cure the liquid epoxy resin to form a solid bonding material.

In FIG. 6E, operation 610 includes decoupling the bond head 401 from the transparent member 406 and moving the bond head 401 away from the transparent member 406. In some examples, vacuum suction is deactivated on the bond head 401 to release the transparent member 406 from the bond head 401. In FIG. 6F, operation 612 includes dispensing a molding material 430 on the substrate 402 to encapsulate the bond wires 422. Operation 612 includes coupling conductive members 420 to the substrate 402. The conductive members 420 are configured to be connected to an external device.

Figure 7:
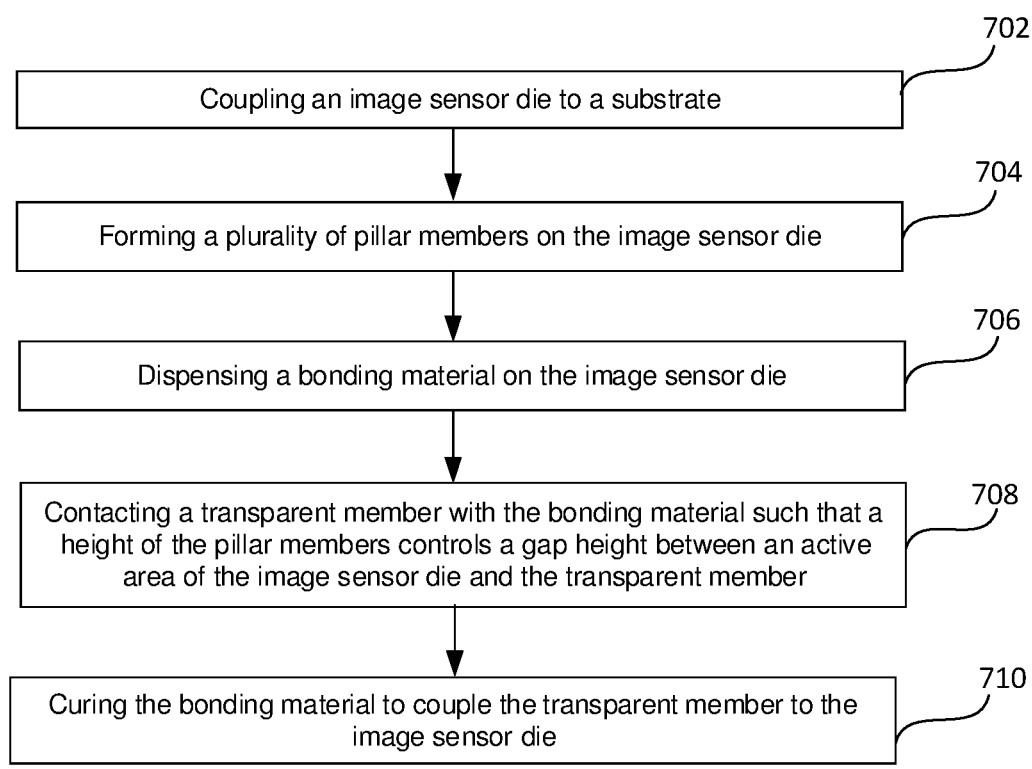
FIG. 7 illustrates a flowchart for fabricating an image sensor package according to an aspect.

FIG. 7 depicts a flowchart 700 depicting example fabrication operations for manufacturing an image sensor package according to an aspect. Although the flowchart 700 is described with reference to the image sensor package 100 of FIGS. 1A through 1C, the flowchart may be applicable to any of the sensor packaging packages discussed herein. Although the flowchart 700 of FIG. 7 illustrates operations in sequential order, it will be appreciated that this is merely an example, and that additional or alternative operations may be included. Further, operations of FIG. 7 and related operations may be executed in a different order than that shown, or in a parallel or overlapping fashion.

Operation 702 includes coupling an image sensor die 104 to a substrate 102. Operation 704 includes forming a plurality of pillar members 125 on the image sensor die 104. Operation 706 includes dispensing a bonding material 124 on the image sensor die 104. Operation 708 includes contacting a transparent member 106 with the bonding material 124 such that a height of the pillar members 125 defines a gap height 105 between an active region 108 of the image sensor die 104 and the transparent member 106. Operation 710 includes curing the bonding material 124 to couple the transparent member 106 to the image sensor die 104.

Figure 8:
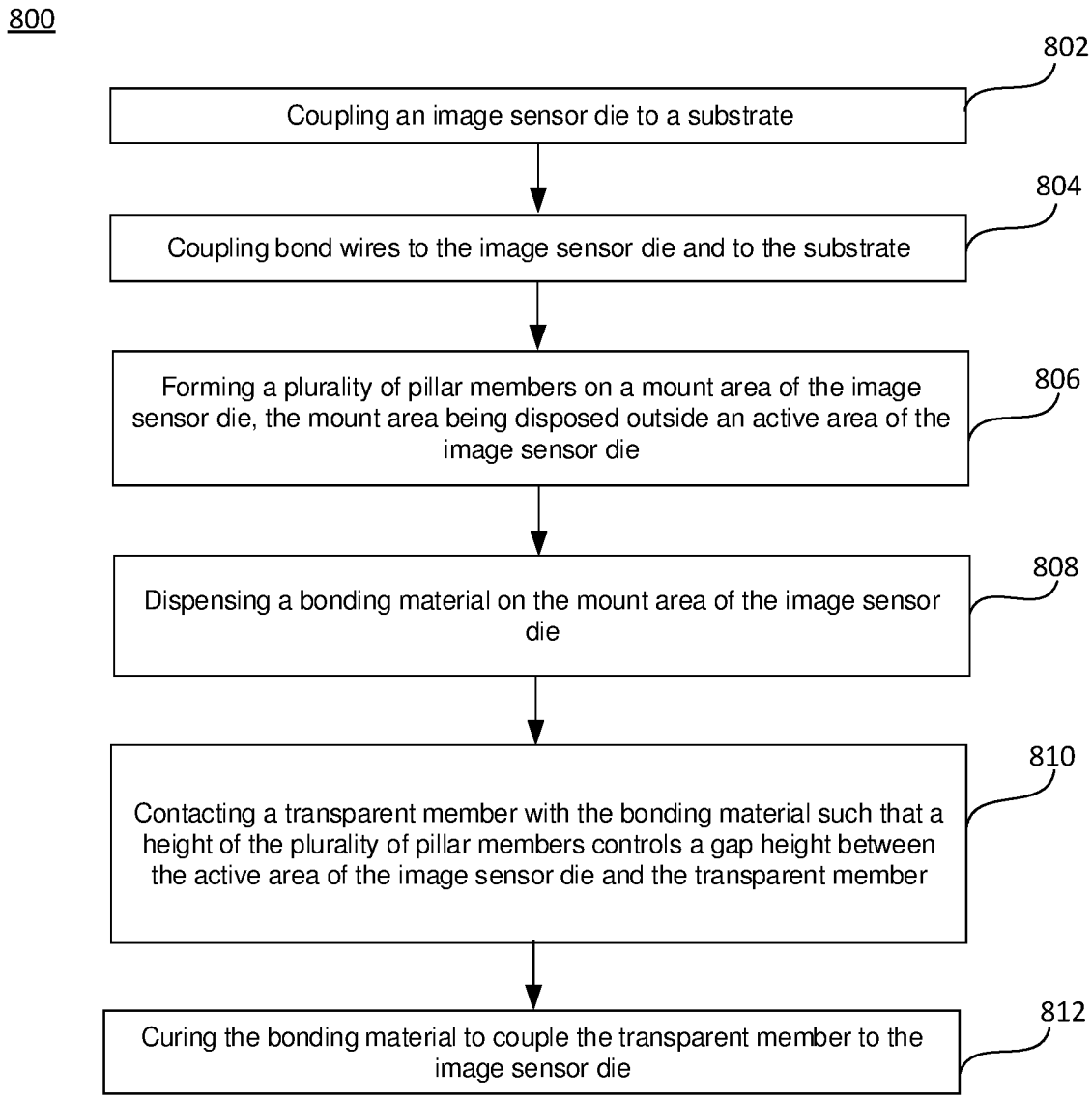
FIG. 8 illustrates a flowchart for fabricating an image sensor package according to another aspect.

FIG. 8 depicts a flowchart 800 depicting example fabrication operations for manufacturing an image sensor package according to an aspect. Although the flowchart 800 is described with reference to the image sensor package 100 of FIGS. 1A through 1C, the flowchart may be applicable to any of the sensor packaging packages discussed herein. Although the flowchart 800 of FIG. 8 illustrates operations in sequential order, it will be appreciated that this is merely an example, and that additional or alternative operations may be included. Further, operations of FIG. 8 and related operations may be executed in a different order than that shown, or in a parallel or overlapping fashion.

Operation 802 includes coupling an image sensor die 104 to a substrate 102. Operation 804 includes coupling bond wires 122 to the image sensor die 104 and to the substrate 102. Operation 806 includes forming a plurality of pillar members 125 on a mount area 123 of the image sensor die 102, where the mount area 123 is disposed outside an active region 108 of the image sensor die 104. Operation 808 includes dispensing a bonding material 124 on the mount area 123 of the image sensor die 104. Operation 810 includes contacting a transparent member 106 with the bonding material 124 such that a height of the plurality of pillar members 125 defines a gap height 105 between the active region 108 of the image sensor die 104 and the transparent member 106. Operation 812 includes curing the bonding material 124 to couple the transparent member 106 to the image sensor die 104.

Figure 9:
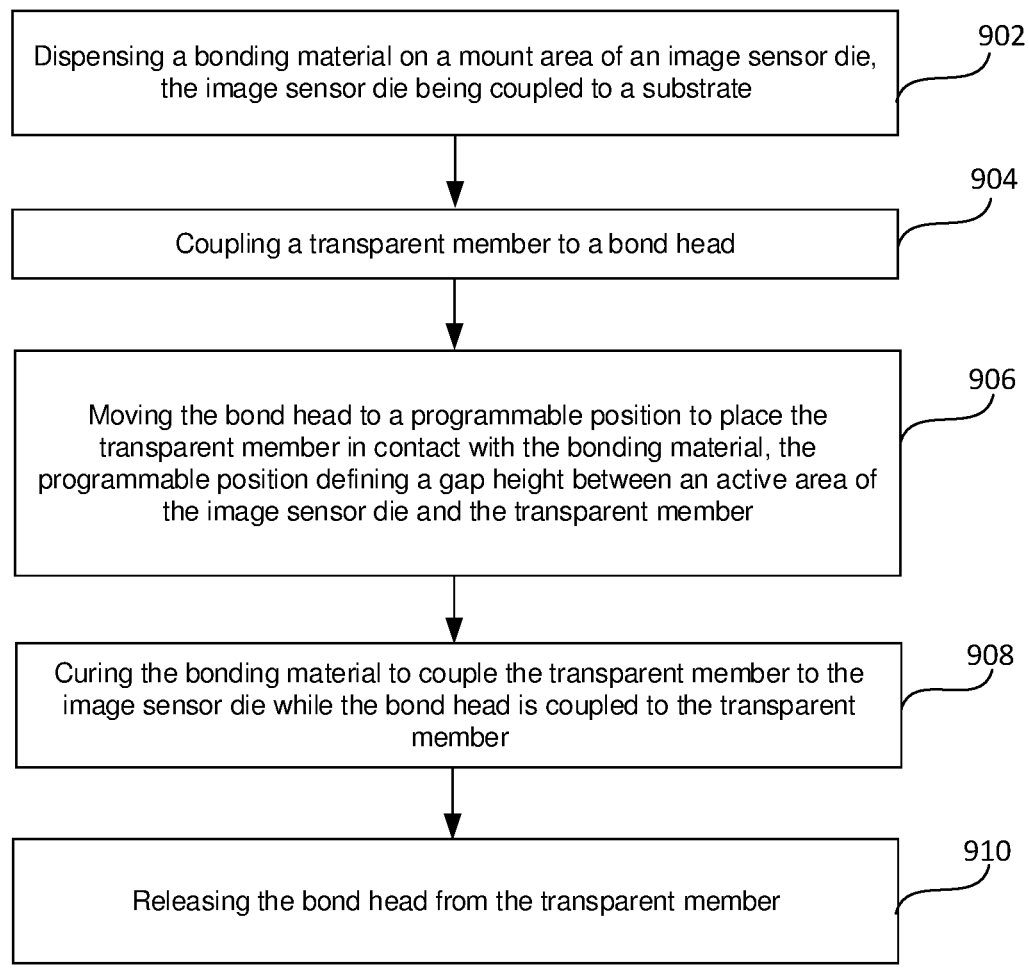
FIG. 9 illustrates a flowchart for fabricating an image sensor package according to another aspect.

FIG. 9 depicts a flowchart 900 depicting example fabrication operations for manufacturing an image sensor package according to an aspect. Although the flowchart 900 is described with reference to the image sensor package 400 of FIG. 4, the flowchart may be applicable to any of the sensor packaging packages discussed herein. Although the flowchart 900 of FIG. 9 illustrates operations in sequential order, it will be appreciated that this is merely an example, and that additional or alternative operations may be included. Further, operations of FIG. 9 and related operations may be executed in a different order than that shown, or in a parallel or overlapping fashion.

Operation 902 includes dispensing a bonding material 424 on a mount area of an image sensor die 404, where the image sensor die 404 is coupled to a substrate 402. Operation 904 includes coupling a transparent member 406 to a bond head 401. Operation 906 includes moving the bond head 401 to a programmable position 484 to place the transparent member 406 in contact with the bonding material 424, where the programmable position 484 defines a gap height 405 between an active region 408 of the image sensor die 404 and the transparent member 406. Operation 908 includes curing the bonding material 424 to couple the transparent member 406 to the image sensor die 404 while the bond head 401 is coupled to the transparent member 406. Operation 910 includes releasing the bond head 401 from the transparent member 406.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A method for fabricating an image sensor package to define a gap height, the method comprising:
    coupling an image sensor die to a substrate;
    forming a plurality of pillar members on the image sensor die;
    dispensing a bonding material on the plurality of pillar members;
    contacting a transparent member with the bonding material such that a height of the plurality of pillar members defines a gap height between an active region of the image sensor die and the transparent member, the bonding material contacting a side of a pillar member, from the plurality of pillar members, that extends between a first end contacting the transparent member and a second end contacting the image sensor die; and
    curing the bonding material to couple the transparent member to the image sensor die.

2. The method of claim 1, wherein the image sensor die includes contact terminals configured to connect to bond wires, wherein the forming the plurality of pillar members on the image sensor die includes:
    dispensing a liquid epoxy resin on a mount area of the image sensor die, the mount area located on a portion of the image sensor die that is between the active region and the contact terminals; and
    curing the liquid epoxy resin to form the plurality of pillar members.

3. The method of claim 2, wherein the liquid epoxy resin is cured using ultraviolet (UV) light.

4. The method of claim 1, wherein the forming the plurality of pillar members on the image sensor die includes forming conductive bumps using a lithograph and plating process.

5. The method of claim 1, wherein the bonding material is dispensed on the plurality of pillar members such that the bonding material encompasses the plurality of pillar members.

6. The method of claim 1, wherein the image sensor die includes contact terminals configured to connect to bond wires, the bonding material is dispensed on a mount area of the image sensor die, the mount area located on a portion of the image sensor die that is between the active region and the contact terminals.

7. The method of claim 6, wherein each of the plurality of pillar members is formed on a separate corner portion of the mount area of the image sensor die.

8. The method of claim 1, wherein the bonding material includes a liquid epoxy resin, wherein the liquid epoxy resin is cured to form a solid bonding material.

9. The method of claim 1, wherein the image sensor die includes contact terminals, the method further comprising:
before the plurality of pillar members are formed on the image sensor die, coupling bond wires to the contact terminals of the image sensor die and to the substrate.

10. The method of claim 1, further comprising:
dispensing a molding material on the substrate after the bonding material is cured.

11. A method for fabricating an image sensor package to define a gap height, the method comprising:
coupling an image sensor die to a substrate, the image sensor die including an active region and contact terminals;
coupling bond wires to the contact terminals of the image sensor die and to the substrate;
forming a plurality of pillar members on a mount area of the image sensor die, the mount area being disposed on a portion of the image sensor die that is between the active region and the contact terminals;
dispensing a bonding material on the plurality of pillar members and the mount area of the image sensor die;
contacting a transparent member with the bonding material such that a height of the plurality of pillar members defines a gap height between the active region of the image sensor die and the transparent member; and
curing the bonding material to couple the transparent member to the image sensor die.

12. The method of claim 11, wherein the forming the plurality of pillar members on the mount area of the image sensor die includes:
dispensing a liquid epoxy resin on corner portions of the mount area of the image sensor die;
curing the liquid epoxy resin to form the plurality of pillar members.

13. The method of claim 11, wherein the forming the plurality of pillar members on the mount area of the image sensor die includes forming conductive bumps on a separate corner portion of the mount area of the image sensor die.

14. The method of claim 11, wherein a pillar member of the plurality of pillar members includes an L-shape.

15. A method for fabricating an image sensor package to define a gap height, the method comprising:
dispensing a bonding material on a mount area of an image sensor die, the image sensor die being coupled to a substrate;
coupling a transparent member directly to a bond head;
moving the bond head to a programmable position to place the transparent member in contact with the bonding material, the programmable position defining a gap height between an active region of the image sensor die and the transparent member;
curing the bonding material to couple the transparent member to the image sensor die while the bond head is coupled to the transparent member; and
releasing the bond head from the transparent member.

16. The method of claim 15, further comprising:
reprogramming, using a controller operably coupled to the bond head, the programmable position to increase the gap height between the active region of the image sensor die and the transparent member.

17. The method of claim 15, wherein the bonding material includes a liquid epoxy resin that is cured to form a solid bonding material, the liquid epoxy resin having a viscosity greater than a threshold level.

18. The method of claim 15, wherein the coupling the transparent member to the bond head includes activating vacuum suction on the bond head, wherein the releasing the bond head from the transparent member includes deactivating vacuum suction on the bond head.

19. The method of claim 15, further comprising:
dispensing a molding material on the substrate after the bond head is released from the transparent member.

20. The method of claim 11, wherein the bonding material contacts a side of a pillar member, from the plurality of pillar members, that extends between a first end contacting the transparent member and a second end contacting the image sensor die.

* * * * *